United States Patent
Andrews

(10) Patent No.: US 10,944,031 B2
(45) Date of Patent: Mar. 9, 2021

(54) SOLID STATE LIGHTING COMPONENT PACKAGE WITH CONFORMAL REFLECTIVE COATING

(71) Applicant: Cree, Inc., Durham, NC (US)

(72) Inventor: Peter Andrews, Durham, NC (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 15/885,215

(22) Filed: Jan. 31, 2018

(65) Prior Publication Data

US 2018/0240951 A1 Aug. 23, 2018

Related U.S. Application Data

(62) Division of application No. 13/902,411, filed on May 24, 2013, now Pat. No. 9,923,132.

(51) Int. Cl.
| | |
|---|---|
| *H01L 33/60* | (2010.01) |
| *H01L 25/075* | (2006.01) |
| *H01L 33/00* | (2010.01) |
| *H01L 33/08* | (2010.01) |

(52) U.S. Cl.
CPC .......... *H01L 33/60* (2013.01); *H01L 25/0753* (2013.01); *H01L 33/005* (2013.01); *H01L 33/08* (2013.01); *H01L 2224/48091* (2013.01); *H01L 2224/48227* (2013.01); *H01L 2224/73265* (2013.01); *H01L 2924/00* (2013.01); *H01L 2924/00014* (2013.01); *H01L 2924/12044* (2013.01); *H01L 2933/0058* (2013.01)

(58) Field of Classification Search
None
See application file for complete search history.

(56) References Cited

U.S. PATENT DOCUMENTS

| | | | |
|---|---|---|---|
| D658,139 S | 4/2012 | Andrews et al. | |
| D660,257 S | 5/2012 | Andrews et al. | |
| 8,803,201 B2 | 8/2014 | Andrews | |
| 9,287,475 B2 | 3/2016 | Andrews et al. | |
| 2007/0252523 A1* | 11/2007 | Maeda | C04B 41/009 |
| | | | 313/506 |
| 2007/0272938 A1 | 11/2007 | Maeda et al. | |
| 2008/0054290 A1 | 3/2008 | Shieh et al. | |

(Continued)

FOREIGN PATENT DOCUMENTS

| | | |
|---|---|---|
| DE | 102009047888 A1 | 3/2011 |
| JP | 2013062500 A | 4/2013 |

OTHER PUBLICATIONS

International Bureau of WIPO; International Preliminary Report on Patentability for International Application No. PCT/US2014/039183 dated Dec. 3, 2015, 11 Pages.

(Continued)

*Primary Examiner* — Benjamin P Sandvik
(74) *Attorney, Agent, or Firm* — Myers Bigel, P.A.

(57) ABSTRACT

A solid state lighting package is provided. The package comprising at least one LED element positioned on a top surface of a substrate and a conformal reflective layer of inorganic particles, whereby at least of portion of the light emitted by the LED element is reflected by the conformal reflective layer. A method of manufacturing a solid state lighting package comprising the distribution of inorganic particles, and a method of increasing the luminous flux thereof, is also provided.

9 Claims, 12 Drawing Sheets

(56) References Cited

U.S. PATENT DOCUMENTS

| | | | |
|---|---|---|---|
| 2009/0057699 A1* | 3/2009 | Basin | H01L 33/56 257/98 |
| 2009/0213591 A1* | 8/2009 | Katabe | G02B 5/0221 362/236 |
| 2010/0276638 A1 | 11/2010 | Liu et al. | |
| 2011/0248287 A1* | 10/2011 | Yuan | H01L 33/60 257/88 |
| 2012/0068198 A1 | 3/2012 | Andrews et al. | |
| 2012/0069564 A1 | 3/2012 | Andrews et al. | |
| 2012/0193647 A1 | 8/2012 | Andrews | |
| 2013/0037842 A1 | 2/2013 | Yamada et al. | |
| 2013/0039617 A1 | 2/2013 | Illek et al. | |
| 2013/0099276 A1* | 4/2013 | Fukushima | H01L 33/46 257/99 |
| 2014/0313713 A1 | 10/2014 | Andrews | |

OTHER PUBLICATIONS

European Patent Office; International Application No. PCT/US2014/039183; International Search Report and Written Opinion dated Sep. 22, 2014, 15 pages.
U.S. Appl. No. 61/384,623, filed Sep. 20, 2010.
U.S. Appl. No. 61/390,963, filed Oct. 7, 2010.
U.S. Appl. No. 61/390,966, filed Oct. 7, 2010.
U.S. Appl. No. 13/902,411, filed May 24, 2013, now, pending.

* cited by examiner

SOLID STATE LIGHTING COMPONENT PACKAGE WITH CONFORMAL REFLECTIVE COATING

CROSS-REFERENCE TO RELATED APPLICATIONS

This application is a Divisional of U.S. application Ser. No. 13/902,411, filed May 24, 2013, (now U.S. Pat. No. 9,923,132, issued on Mar. 20, 2018) the entirety of each of which is incorporated herein by reference.

TECHNICAL FIELD

The present disclosure relates to a solid state lighting package and a manufacturing method thereof, and more specifically, to a solid state lighting package comprising a conformal reflective layer comprising reflective, inorganic particles on the substrate of the solid state lighting package.

BACKGROUND

In order to use an LED chip in a circuit or other like arrangement, it is known to enclose an LED chip in a package to provide environmental and/or mechanical protection, color selection, light focusing and the like. An LED package also includes electrical leads, contacts or traces for electrically connecting the LED package to an external circuit.

Some LED packages (e.g. XLamp™ LEDs provided by Cree, Inc.) incorporate one LED chip and higher light output is achieved at the assembly level by mounting several of these LED packages onto a single circuit board. Other LED packages comprise arrays of many LED packages. Alternatively, higher flux components have been provided by utilizing arrays of cavities, with a single LED chip mounted in each of the cavities. (e.g., TitanTurbo™. LED Light Engines provided by Lamina, Inc.)

It is also generally observed that LED's perform best when operating temperatures are minimized. Thus, it is generally desirable to remove heat from the LED, typically by heat transfer via the substrate or submount. One of the best ceramic substrates for heat transfer is aluminum nitride (AlN). However, at least one problem with AlN as a heat transfer material in a LED package is that it is not very reflective, which absorbs visible light and reduces the total luminous flux of the package. Conventional technology is to cover as much of the heat transfer material and/or dead space areas with reflective metal, or with white soldermask to maximize reflectivity while at the same time providing heat transfer. Unfortunately, metal cannot be applied everywhere in high density LED packages due to its electrical conductive properties. There is also a significant amount of area (e.g., known as "canyon walls") between light emitting elements that also absorb or poorly reflect the luminous light. These conventional solutions are, for the most part, inadequate for maximizing the total luminous flux of a solid state lighting package.

SUMMARY

Thus, in a first embodiment, a solid state lighting package is provided. The package comprising at least one LED element positioned on a top surface of a substrate or a submount capable of absorbing light emitted by the at least one LED element; and a conformal reflective layer deposited on the top surface of the substrate or the submount in proximity to the at least one LED element, the conformal reflective layer comprised of reflective inorganic particles.

In a first aspect of the first embodiment, the conformal reflective layer consists essentially of inorganic particles of at least one of titanium dioxide, silicon dioxide, zinc oxide, or mixtures thereof. The reflective inorganic particles can consists essentially of titanium dioxide. The average particle size of the reflective inorganic particles are of an average particle size sufficient to reflect and/or diffract one or more wavelengths of light emitted by the one or more LED elements.

In a second aspect, alone or in combination with any of the previous aspects of the first embodiment, the conformal reflective layer can essentially surrounding each of the at least one LED elements. At least a portion of the conformal reflective layer can be between the at least one LED and the top surface of the substrate or the sub mount.

In a third aspect, alone or in combination with any of the previous aspects of the first embodiment, the solid state lighting package can further comprise a transparent matrix deposited on or under the conformal reflective layer. The transparent matrix may contain a reflective material dispersed, suspended, or distributed therein. The transparent matrix can be directly deposited on the conformal reflective layer. The transparent matrix can be at least one of mineral oils, silicone oils, any transparent fluid or cured matrix, methyl and phenyl silicones, polydialkylsiloxane, polydialkylphenylsiloxane, polydialkylalkylphenylsiloxane, and polyalklyphenylsiloxanes, or blends thereof. The reflective material can be the same or different from that of the conformal reflective layer.

In a fourth aspect, alone or in combination with any of the previous aspects of the first embodiment, the solid state lighting package can further comprise a color shifting element, a diffusing material, or a diffractive material.

In a fifth aspect, alone or in combination with any of the previous aspects of the first embodiment, the at least one LED element comprises an array of LED elements.

In a sixth aspect, alone or in combination with any of the previous aspects of the first embodiment, the substrate or submount absorbs at least one wavelength emitted by the at least one LED element. The substrate or submount can comprise aluminum oxide or aluminum nitride or PCB, and the at least one LED can comprise sapphire. The substrate or submount can comprise aluminum oxide, aluminum nitride, or a PCB board, and the at least one LED can comprise silicon carbide or sapphire. The substrate or submount can comprise aluminum oxide, a metal contact layer deposited directly on the aluminum oxide, and the at least one LED can be deposited directly on the metal contact layer The substrate or submount can comprise substrate or submount absorbing at least one wavelength emitted by the at least one LED element, a metal contact layer deposited directly on the substrate/submount, and the at least one LED can be deposited directly on the metal contact layer, the at least one LED at least partially overhanging the metal contact layer, the conformal reflective layer being at least partially positioned beneath the overhang.

In a second embodiment, a method of manufacturing a solid state lighting package is provided. The method comprising introducing an organic solvent comprising a dispersion or distribution of reflective inorganic material to a substrate or submount having at least one LED element mounted thereon; removing the organic solvent and forming a conformal reflective layer of reflective inorganic particles in proximity to the at least one LED element and covering at least a portion of the substrate or submount.

In a first aspect of the second embodiment, the at least one LED element can be post die attached and wire bonded to the substrate or submount before or after forming the conformal reflective layer of inorganic particles.

In a second aspect, alone or in combination with any of the previous aspects of the second embodiment, the reflective inorganic material can be at least one of titanium dioxide, silicon dioxide, or zinc oxide. The reflective inorganic material can consists essentially of titanium dioxide.

In a third aspect, alone or in combination with any of the previous aspects of the second embodiment, the reflective inorganic particles are of an average particle size sufficient to reflect and/or diffract one or more wavelengths of light emitted by the one or more LED elements.

In a fourth aspect, alone or in combination with any of the previous aspects of the second embodiment, the organic solvent can be aromatic. The ratio of the organic solvent to reflect on the organic material can be between about 5:1 to about 1:1.

In a fifth aspect, alone or in combination with any of the previous aspects of the second embodiment, the method can further comprise the step of (i) introducing an LED-covering film prior to the introduction of the organic solvent comprising the reflective inorganic material. The method can further comprise the step of removing the LED-covering film after introduction of the organic solvent comprising the reflective inorganic material.

In a sixth aspect, alone or in combination with any of the previous aspects of the second embodiment, the method can further comprise the step of introducing a transparent matrix to the conformal reflective layer of inorganic particles before or after the introducing step. The transparent matrix can be deposited directly on the conformal reflective layer. The transparent matrix can have an index of refraction of between about 1.4 and about 1.5. The transparent matrix can further comprise one or more highly reflective material of an index of refraction of between about 1.8 and about 2.4. The highly reflective material can be the same or different from that of the conformal reflective layer.

In a third embodiment, a method of increasing the luminous flux of a solid state lighting package is provided. The method comprising providing a solid state lighting package having at least one LED element mounted on a substrate or submount capable of absorbing light emitted by the at least one LED element; providing a conformal reflective layer of reflective inorganic particles in proximity to the at least one LED element and covering at least a portion of the substrate or submount; and reflecting light emitted by the at least one LED element by the conformal reflective layer, thereby increasing the luminous flux of the solid state lighting package.

In a first aspect of the third embodiment the at least one LED element can be post die attached and wire bonded to the substrate or submount before or after providing the conformal reflective layer.

In a second aspect, alone or in combination with any of the previous aspects of the third embodiment, the distribution of inorganic particles has an average particle size sufficient to reflect and/or diffract one or more wavelengths of light emitted by the one or more LED elements.

In a third aspect, alone or in combination with any of the previous aspects of the third embodiment, the thickness of the conformal reflective layer can be less than the minimum vertical height of the at least one LED element from its corresponding mount on the substrate or submount.

In a fourth aspect, alone or in combination with any of the previous aspects of the third embodiment, the method can further comprise providing a transparent matrix having an index of refraction of between about 1.4 and about 1.5. The transparent matrix can further comprise a highly reflective material having an index of refraction of between about 1.8 and about 2.4.

In a fifth aspect, alone or in combination with any of the previous aspects of the third embodiment, the transparent matrix can further comprise a color shifting element, a diffusing material, or a diffractive material.

In a sixth aspect, alone or in combination with any of the previous aspects of the third embodiment, the substrate or submount absorbs at least one wavelength emitted by the at least one LED element.

DETAILED DESCRIPTION

Figure 1:
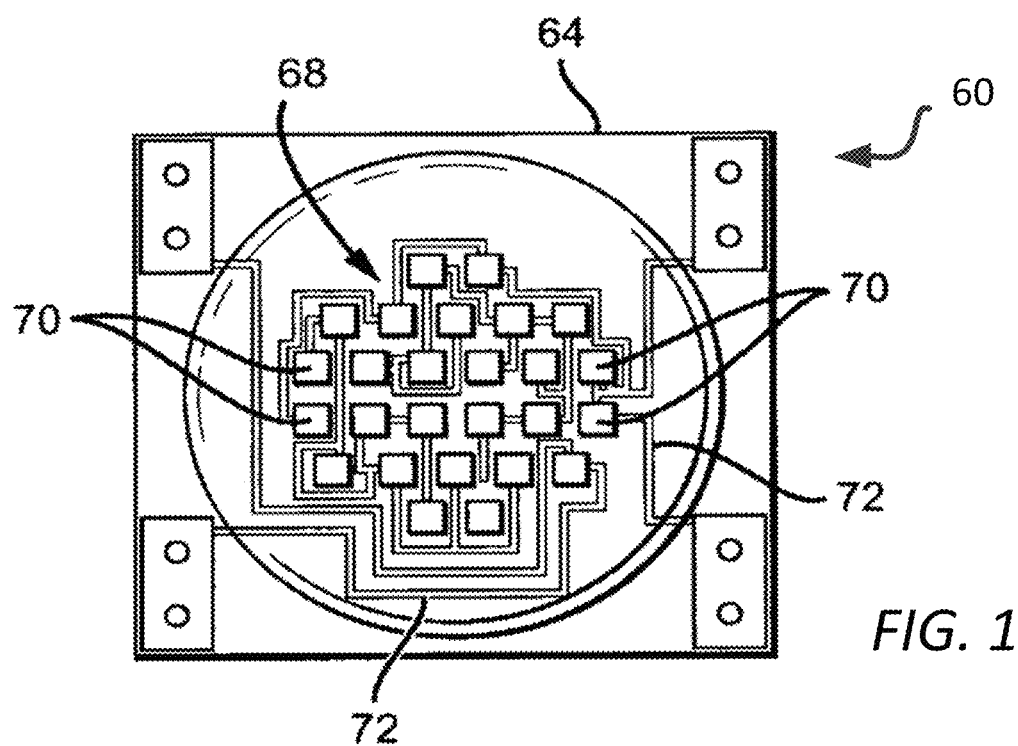
FIG. 1 is a top plan view of an LED component according to the present disclosure.

A solid state lighting package having a conformal reflective layer of inorganic particles and a manufacturing method thereof according to exemplary embodiments of the present disclosure will be described along with reference to the accompanying drawings. Reference is made to a solid state lighting package, however, any light emitting diode (LED) package is envisaged using the distribution of inorganic particles according to the present disclosure. LED packages disclosed herein are inclusive of all surface mounted devices (SMD) type packages. Examples of solid state lighting packages include ceramic packages, polyimide packages, lead frame package, and combinations thereof.

Embodiments of the present disclosure now will be described more fully hereinafter with reference to the accompanying drawings, in which embodiments of the present disclosure are shown. This present disclosure may, however, be embodied in many different forms and should not be construed as limited to the embodiments set forth herein. Rather, these embodiments are provided so that this disclosure will be thorough and complete, and will fully convey the scope of the claims to those skilled in the art. Like numbers refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated' listed items.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer or region to another element, layer or region as illustrated in the figures. It will be understood that these terms are intended to encompass different orientations of the device in addition to the orientation depicted in the figures.

The terminology used herein is for the purpose of describing particular embodiments only and is not intended to be limiting of the present disclosure. As used herein, the singular forms "a", "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof Unless otherwise defined, all terms (including technical and scientific terms) used herein have the same meaning as commonly understood by one of ordinary skill in the art to which this present disclosure belongs. It will be further understood that terms used herein should be interpreted as having a meaning that is consistent with their meaning in the context of this specification and the relevant art and will not be interpreted in an idealized or overly formal sense unless expressly so defined herein.

Unless otherwise expressly stated, comparative, quantitative terms such as "less" and "greater", are intended to encompass the concept of equality. As an example, "less" can mean not only "less" in the strictest mathematical sense, but also, "less than or equal to."

The terms "LED" and "LED device" as used herein may refer to any solid-state light emitter. The terms "solid state light emitter" or "solid state emitter" may include a light emitting diode, laser diode, organic light emitting diode, and/or other semiconductor device which includes one or more semiconductor layers, which may include silicon, silicon carbide, gallium nitride and/or other semiconductor materials, a substrate which may include sapphire, silicon, silicon carbide and/or other microelectronic substrates, and one or more contact layers which may include metal and/or other conductive materials. A solid-state lighting device produces light (ultraviolet, visible, or infrared) by exciting electrons across the band gap between a conduction band and a valence band of a semiconductor active (light-emitting) layer, with the electron transition generating light at a wavelength that depends on the band gap. Thus, the color (wavelength) of the light emitted by a solid-state emitter depends on the materials of the active layers thereof. In various embodiments, solid-state light emitters may have peak wavelengths in the visible range and/or be used in combination with lumiphoric materials having peak wavelengths in the visible range. Multiple solid state light emitters and/or multiple lumiphoric materials (i.e., in combination with at least one solid state light emitter) may be used in a single device, such as to produce light perceived as white or near white in character. In certain embodiments, the aggregated output of multiple solid-state light emitters and/or lumiphoric materials may generate warm white light output having a color temperature range of from about 2200K to about 7000K.

A solid-state lighting system, e.g., a LED lighting system or device, may take the form of a lighting unit, light fixture, light bulb, or a "lamp." Embodiments of the present disclosure provide a solid-state lamp with centralized light emitters, more specifically, LEDs (hereinafter, interchangeably used with "LED lamp" or "LED bulb" Multiple LEDs can be used together, forming an LED array. The LEDs can be mounted on or fixed within the lamp in various ways. It should also be noted that the term "lamp" is meant to encompass not only a solid-state replacement for a traditional incandescent bulb as illustrated herein, but also replacements for fluorescent bulbs, replacements for complete fixtures, and any type of light fixture that may be custom designed as a solid state fixture for mounting on walls, in or on ceilings, on posts, and/or on vehicles.

An LED lighting system may include, for example, a packaged light emitting device including one or more light emitting diodes (LEDs), which may include inorganic LEDs, which may include semiconductor layers forming p-n junctions and/or organic LEDs (OLEDs), which may include organic light emission layers. Light perceived as white or near-white may be generated by a combination of red, green, and blue ("RGB") LEDs. Output color of such a device may be altered by separately adjusting supply of current to the red, green, and blue LEDs. Another method for generating white or near-white light is by using a lumiphor such as a phosphor. Still another approach for producing white light is to stimulate phosphors or dyes of multiple colors with an LED source. Many other approaches can be taken.

An LED lamp may be made with a form factor that allows it to replace a standard incandescent bulb, or any of various types of fluorescent lamps. LED lamps often include some type of optical element or elements to allow for localized mixing of colors, collimate light, or provide a particular light pattern. Sometimes the optical element also serves as an envelope or enclosure for the electronics and or the LEDs in the lamp.

Since, ideally, an LED lamp designed as a replacement for a traditional incandescent or fluorescent light source needs to be self-contained; a power supply is included in the lamp structure along with the LEDs or LED packages and the optical components. A heatsink is also often needed to cool the LEDs and/or power supply in order to maintain appropriate operating temperature. The power supply and especially the heatsink can often hinder some of the light coming from the LEDs or limit LED placement. Depending on the type of traditional bulb for which the solid-state lamp is intended as a replacement, this limitation can cause the solid-state lamp to emit light in a pattern that is substantially different than the light pattern produced by the traditional light bulb that it is intended to replace.

In a first embodiment, at least one LED element positioned on a top surface of a substrate or a submount capable of absorbing light emitted by the at least one LED element; and a conformal reflective layer comprising a distribution of inorganic particles, the distribution of inorganic particles at least partially surrounding the at least one LED element, and covering at least a portion of the top surface of the substrate or the submount, whereby at least of portion of the light emitted by the LED element is reflected by the distribution of inorganic particles is provided. In one aspect, the distribution of inorganic particles touches the at least one LED element. The distribution of inorganic particles can be employed in combination with a metal reflector element to increase luminous efficacy and minimize loss of luminous flux of the LED package. The formation of the conformal reflective layer comprising the distribution of inorganic particles according to the present disclosure can be applied to a LED package and improve the luminous flux of emitted warm white light or cool white light. In another aspect, the conformal reflective layer comprising the distribution of inorganic particles can be applied to a LED package and improve a color rendering index of emitted white light.

In one aspect, the lighting package comprises a plurality of LED elements in a densely packed arrangement. In one aspect, the plurality of LED elements are arranged on the substrate so as to form channels therebetween. In this aspect, the conformal reflective layer of inorganic particles is introduced into the channels between the plurality of LED elements, e.g., after die attachment and wire bonding.

In one aspect, the lighting package comprises a plurality of wire bond LED elements in a densely packed arrangement arranged on a substrate or submount such as aluminum oxide, the conformal reflective layer of inorganic particles introduced after die attachment and wire bonding. In this aspect, the LED elements can be sapphire or silicon based, or SiC based LEDs. In one aspect, compositions and methods disclosed herein can be used on top surface of top emitting LEDs, such as WZ™ or EZ™ chips sold by Cree, or AlInGaP LEDs e.g., that provide red/orange wavelengths.

In another aspect, the lighting package comprises a plurality of "flip-chip" configured LED elements mounted on a metal contacts in a densely packed arrangement arranged on a substrate or submount, at least a portion of the LED elements overhanging the metal contacts, the conformal reflective layer of inorganic particles introduced within the overhang (between the substrate and the overhanging LED element). In this aspect, the LED elements can be silicon carbide.

Conformal Reflective Layer of Inorganic Particles

In one aspect, the conformal reflective layer of inorganic particles is comprised of nano-sized highly reflective inorganic particles that adhere to the substrate or submount. Nano-sized highly reflective inorganic particles include by way of example average particle size between about 0.1 nm and about 1000 nm, between about 1 nm and about 750 nm, or between about 10 nm and about 500 nm. While not to be held to any particular theory, it is believed that the nano sized highly reflective inorganic particles self-associate or agglomerate to form a layer or layer-like coating on the surface of the substrate or submount. The highly reflective inorganic particles can be any material with a high index of refraction. In one aspect, the highly refractive material has an index of refraction of greater than about 1.8, greater than about 2, preferably greater than about 2.2, and most preferably greater than or equal to about 2.4. Suitable examples of high index of refraction material include titanium dioxide (n=2.4), zinc oxide, zinc sulfide, barium sulfate, boron nitride, talc, silica, alumina, zeolite, calcium carbonate, magnesium carbonate, barium sulfate, zinc oxide, titanium oxide, aluminum hydroxide, magnesium hydroxide, mica, montmorillonite clay, carbon particles, glass particles, carbon nanotubes, and mixtures thereof. An example of a material suitable for use as the reflective material in the conformal reflective layer is available under the tradename Ti-Pure™ titanium dioxide (DuPont) which comprises a majority of rutile $TiO_2$ and stabilization additives to inhibit flocculation.

Masking of LED Components

In one embodiment, the top surface and/or sides of the LED element is masked to provide for a protective, LED covering film/coating to be dispensed on the LEDs. Thus, in one embodiment, one or more water-soluble resins can serve as a LED-covering film, and is not limited, provided that it is a material which can form a film when dissolved in a solvent, such as water, coated, dried, and subsequently removed using an aqueous-based solution. Examples of water-soluble resins suitable for this purpose include polyvinyl alcohol, polyvinyl pyrrolidone, polyethylene glycol with 5 or more oxyethylene recurring units, polyethylene oxide, methylcellulose, ethylcellulose, hydroxypropyl cellulose, polyacrylic acid, polyvinyl alcohol-polyacrylic acid block copolymer, polyvinyl alcohol-polyacrylic acid ester block copolymer, and polyglycerin. These resins can be used alone or in combination of two or more. The LED-covering film formed on the LEDs is subsequently removed by washing with water after deposition of the organic solvent: reflective inorganic material precursor to the deposition layer.

In one aspect, the water-soluble resin preferentially binds or associates with the LED element relative to that of the substrate or submount. For example, a resin having an ether linkage or a hydroxyl group, as a polar group, for example, polyvinyl alcohol or polyethylene glycol, can be used. In another aspect, a water-soluble resin having a polar group, such as a carboxyl group or a tertiary amine, is used to bind firmly to the LED (chip face), and is likely to remain on the wafer face after contact by the organic solvent: reflective inorganic material composition. In order to improve the removal of the LED-covering film with water, the degree of polymerization or molecular weight of the water-soluble resin used can be selected to be between 200 and 2,000, although other molecular weights can be used. Alternatively, a water-soluble resin with a high degree of polymerization or a high molecular weight can be used in combination with a plasticizer that induces dissolution. In one aspect, the viscosity of the LED-covering film (also referred to as a "covering layer") is adjusted such that the resulting surface tension of the covering film is improved so as to adhere/hold onto the die shape without breaking or bridging onto the substrate).

Plasticizers can be used for enhancing the water-dissolution of the LED-covering film, particularly when the water-soluble resin is of a high molecular weight. Suitable plasticizers include water-soluble, low molecular weight compounds such as ethylene glycol, triethylene glycol, tetraethylene glycol, ethanolamine, and glycerin, used alone or in combinations of two or more with the water-soluble resins described above. Such a plasticizer is used in such an amount such that after coating and drying of the LED-covering film solution, phase separation does not occur between the plasticizer and the water-soluble resin. In one aspect, 75 parts by weight or less, or 20 to 75 parts by weight, based on 100 parts by weight of the water-soluble resin of the plasticizer can be used.

Surface adhesion agents can be used in combination with the LED-covering film. Suitable agents are water-soluble, and are dispersed or distributed uniformly in the LED-covering film. Moreover, they can be chosen to provide high affinity for the LED surfaces, in contrast to the submount or substrate, and can form a LED-covering film adherent to the LED and/or preferentially adherent to the LED in contrast to the submount. Alternatively, a mask or masking techniques can be used to deposit the LED-covering film specifically on the LED with substantially no deposition of the LED-covering film on the substrate.

Surface active agents can be used to enhance the coating properties and/or dissolution properties of the LED-covering film, such as nonionic, cationic, anionic or ampholytic type surface active agents, provided that they are water-soluble. Examples of nonionic surface active agents include nonyl phenol-based, higher alcohol-based, polyhydric alcohol-based, polyoxyalkylene glycol-based, polyoxyethylene alkyl ester-based, polyoxyethylene alkyl ether-based, polyoxyethylene alkylphenol ether-based, and polyoxyethylene sorbitan alkyl ester-based surface active agents. Examples of cationic surface active agents are quaternary ammonium salts and amine salts. Examples of anionic surface active agents are alkylbenzenesulfonic acids and their salts, alkylsulfuric ester salts, methyltaurates, and ether sulfonates. Examples of ampholytic surface active agents are imidazoliniumbetaine-based, amidopropylbetaine-based, and aminodipropionate-based surface active agents. One or a combination of two or more of these surface active agents can be used. The amount of any such surface active/adhesive agent can be independently 10-1000 ppm by weight based on the water-soluble resin of the LED-covering film.

Suitable solvents for use in preparing a dispensable solution resulting in the LED-covering film may be a solvent comprising the aforementioned water-soluble resin and water-soluble surface adhesion and/or active agents. Examples of solvents include water, and water in combination with one or more alcohols, esters, alkylene glycols, alkylene glycol monoalkyl ethers, and alkylene glycol monoalkyl ether acetates. In one aspect, water and alkylene glycol monoalkyl ethers are used. In yet another aspect, alkylene glycol monoalkyl ether, propylene glycol monomethyl ether (PGME) is used.

The above-described LED-covering film agent of the present disclosure is coated on the surface and/or proximity of the LEDs on the substrate or submount. Where a plurality of LEDs are partitioned and/or arranged in a lattice layout are provided, the LED-covering film can be deposited mechanically (e.g., using computer-controlled dispensing means) or via a masking technique followed by drying the film, whereby the LED-covering film about the LEDs is formed, with the substrate and or submount essentially uncoated. The thickness of the LED-covering film (the dry thickness of the LED-covering film) can be about 0.1 micron to about 5 microns. If the thickness of the LED-covering film is too thin, projections or overhangs of the LED chips may protrude through the LED-covering film and the subsequent deposit of the reflective inorganic deposition layer may occur on the LED faces. A thick LED-covering film, on the other hand, provides no particular advantages, but by contrast, requires excess washing time with water after processing to remove the film.

Forming the Distribution of Inorganic Particles on a LED Die Substrate

In an embodiment of the present disclosure, a method of forming the conformal reflective layer comprising inorganic particles for a LED package capable of improving luminous efficacy and minimizing loss of luminous flux is provided. Thus, in one aspect, a manufacturing method is provided comprising providing a suspension or dispersion of inorganic particles in an organic solvent suitable for casting or flooding the LED substrate. The method further comprises introducing the suspension or dispersion of inorganic particles to the substrate and evaporating the organic solvent so as to leave behind a thin layer of inorganic particles. In one aspect the inorganic particles have an average size distribution between $0.1\mu$ and $1000\mu$. In one aspect, the inorganic particles are nanoparticles. In one aspect, the inorganic particles are titanium dioxide nanoparticles, for example Ti-Pur (Dupont, Del.) having a D50 average particle size between about 200 nm to about 400 nm. Other average particle sizes may be used, for example, 50 nm, 75 nm, 100 nm, 150 nm, 250 nm, 325 nm, 500 nm, 750 nm, or 1000 nm, depending on the chemical composition of the reflective material, the organic solvent used, the desired thickness of the conformal reflective layer, the color light emitted, and the desired increase in luminosity required for the LED package. Combinations of particle size distributions of $TiO2$ particles can be used, e.g., ~150 nm for reflecting blue light together with particles of 250-300 nm for reflecting non-blue light. The organic solvent can be a low viscosity low boiling liquid such as an aromatic, including one or more of benzene, xylene, toluene, and the like, or petroleum distillate, kerosene, mineral spirits, and the like. Ratio of organic solvent to inorganic material can be about 10:1 to about 1:2, about 7:1 to about 1:1, about 5:1 to about 2:1, or about 4:1 to about 3:1. The ratio of organic solvent to inorganic material can be adjusted to control the thickness of the conformal reflective layer. In one aspect, the organic solvent viscosity and vapor pressure are chosen so as to prevent wicking of the organic solvent: inorganic material composition onto the faces of the LED components during presentation to the substrate. In contrast to curable polymer matrices containing reflective inorganic materials, the present disclosure avoids "wicking" and allows the composition, for example, in flip-chip configurations, to enter and deposit the inorganic reflective material under overhangs formed from LED components extending beyond their metal contacts. Such overhangs usually present vertical heights of 10 micron or less. The organic solvent: inorganic material composition provides a "snow"-like coating on the substrate that is tenaciously held in place on the substrate. During this "flooding" stage, all surfaces under the "water-line" of solvent can be contacted and ultimately conformably coated by the inorganic particles. As the solvent evaporates, the suspended inorganic material is gradually packed together forming a "fresh-snow-fall" appearance comprising a dense layer of material. This dense layer of inorganic particles provides a dense field of high-index-of-refraction particles which effectively turns emitted light away from absorbing structures so that it can be emitted light.

The amount of inorganic material that can be used will at least depend, in part, on the choice of solvent system, the average particle size distribution of the inorganic material used, and target thickness of the conformal layer. Excess amounts of the inorganic material may result in more care required in later processing to eliminate delaminating of the conformal layer and/or poor dispensing/dispersion of the inorganic material. Insufficient amounts of the inorganic particles may result in insignificant gains in total luminous flux for the package. In one aspect, the amount of inorganic particles used with the particular solvent system is configured so that when introduced to the LED package it will provided the conformal reflective layer comprising a distribution of inorganic particles of a predetermined thickness, for example, a thickness less than or equal to the height of a light emitting surface of the substrate/submount mounted LED element. In some embodiments, a thickness of 20-40 microns of rutile TiO2 is used.

Transparent Matrix Containing Reflective and/or Diffusing and/or Color Shifting Elements In one aspect, the LED package comprising a conformal reflective layer can further be contacted with a transparent matrix. The transparent matrix can penetrate at least a portion of the conformal reflective layer, and can optionally bind or adhere it to the substrate. The transparent matrix can further comprise a predetermined loading of at least one high index of refraction reflective material dispersed, distributed, and/or suspended therein. The at least one high index of refraction reflective material can be the same or different from that of the conformal reflective coating. In one aspect, the transparent matrix comprising reflective material is directly coated on at least a portion of the conformal reflective layer. The reflective material of the conformal reflective layer and the reflective material dispersed distributed and/or suspended in the transparent matrix can be the same or can be different reflective materials or combination of reflective materials. In one aspect, the reflective material of the conformal reflective layer and a reflective material in a transparent matrix is compositionally the same, but can be comprised of particles of different size distributions, e.g. the conformal layer having smaller average sized particles than those in the transparent matrix. Thus, in one aspect, the ratio of average particle size distribution of the reflective material of the conformal layer and that of the transparent matrix can be about 0.01 to about 100, or about 0.1 to about 10, or about 1:1.

The transparent matrix can be organic, inorganic, or a mixture thereof. Preferably, the transparent matrix has an index of refraction that is lower than that of the high index of refraction material. For example, the transparent matrix can have an index of refraction of less than about 1.6, preferably less than about 1.5. Preferably, the transparent matrix is transparent in the visible spectra and/or at least a portion of the UV region (e.g., from about 200 nanometers to about 850 nanometers). Preferably, the transparent matrix is at least 85% transparent in the visible spectra and/or at least a portion of the UV region corresponding to the wavelength(s) of the LED light emitted from the package, more preferably, the transparent matrix is at least 90% transparent, most preferably, the transparent matrix is greater than or equal to at least 95% transparent.

The combination of transparent matrix and highly reflective material provides a distribution of inorganic particles that is generally opaque and/or translucent in appearance, in part due to the loading and/or average particle size of the reflective material. In one aspect, the distribution of inorganic particles after introduction to the LED package is a translucent or opaque white or off-white in appearance. In other aspects, the addition of phosphors to the distribution of inorganic particles will provide a colored translucent or opaque distribution of inorganic particles.

Suitable transparent matrix materials (and precursor materials) include transparent organic polymers. Suitable transparent organic polymers include silicones, siloxanes, polyesters, polyurethanes, acrylics (e.g., polyacrylates, polymethacrylates, hereafter "poly(meth)acrylates"), epoxies, fluoropolymers, polyolefins, and co-polymer and/or combinations thereof. In one aspect polydimethylsiloxanes, polydimethylphenylsiloxanes, polyphenylsiloxanes, or blends are employed. Other polydialkyl-, polydialkylphenyl-, polydialkylalkylphenyl- and polyalklyphenyl-siloxane polymers can be substituted for the above transparent matrix. Mixtures, copolymers, and blends of these siloxanes can be used. In one aspect, polydimethylsiloxane and/or polyphenylsiloxanes having sufficient pre-cure viscosities for introduction to the LED package that cure to a gel or hard durometer layer are preferred. In another aspect, the transparent matrix materials are substantially water insoluble.

The highly refractive material can be any material with a high index of refraction. In one aspect, the highly refractive material has an index of refraction of greater than about 1.8, greater than about 2, preferably greater than about 2.2, and most preferably greater than or equal to about 2.4. Suitable examples of high index of refraction material include inorganic compounds, such as titanium dioxide (n=2.4), zinc oxide, zinc sulfide, barium sulfate, boron nitride, talc, silica, alumina, zeolite, calcium carbonate, magnesium carbonate, barium sulfate, zinc oxide, titanium oxide, aluminum hydroxide, magnesium hydroxide, mica, montmorillonite clay, carbon particles, glass particles, carbon nanotubes, and mixtures thereof. The amount of high index of refraction material that can be used will at least depend, in part, on the choice of transparent matrix chosen. To provide suitable reflectivity, while not negatively affecting the viscosity and/or curing and/or dispensability of the transparent matrix, the loading of the high index of refraction material can be between about 3 weight percent to about 50 weight percent.

In certain aspects, the distribution of inorganic particles is comprised of one or more solid materials of about 2.4 index of refraction contained in the transparent matrix of less than about 1.5 index of refraction. For example, in one aspect, a predetermined amount of titanium dioxide (TiO$_2$) comprising a two part, clear silicone matrix can be employed. Titanium dioxide can be present in one or more forms, e.g., rutile, anatase, and brookite. The average particle size of the titanium dioxide particles in the transparent matrix can be between about 1 nanometer (nanoparticles) to about 500 microns. In certain aspects, the size of the titanium dioxide particles is between about 0.1 to about 10 microns, about 0.5 to about 5 microns, or a size distribution mixture can be used. The titanium dioxide can be added to either part (Part A and/or Part B) or both parts of a two-part matrix (e.g., silicone and/or epoxy resin).

In one aspect, a solvent can be added, such as xylene, to the silicone and TiO2 mixture to obtain a desired viscosity for dispensing or flowing the material around and between the structures desired (e.g., "wicking" between LED elements of an array).

In one aspect, the transparent matrix with reflective material can further include one or more color shifting elements, such color shifting elements further discussed below. The color shifting element can be included in the transparent matrix, for example, dispersed or distributed with the highly reflective material. In other aspects, the color shifting element layer can be configured in a separate layer that can be adjacent to, on and/or under the distribution of inorganic particles, e.g., in a multi-layer configuration. In such aspects, different color shifting elements and/or equal or unequal amounts of one or more color shifting elements can be distributed among one or more of the multi-layers. Combinations of the above described configurations of transparent matrix, highly reflective material, and color shifting element can be employed.

In one aspect, the transparent matrix permeates through the reflective layer, even though tightly packed, and provides adhesion between the reflective inorganic particles and/or the substrate.

Thus, in one exemplary embodiment, there is provided a solid state lighting package comprising: a substrate or submount having attached thereto at least one LED element; and a conformal reflective layer comprising a distribution of inorganic particles formed around the at least one LED element and covering at least a portion of the substrate or submount surface. The conformal reflective layer can be of a vertical height relative to the LED chips that is a height flush with a light-emitting surface of the LED chips (e.g., surrounding and/or touching the vertical sides of the LED chips) or can be of any height less than the light-emitting surface of the LED chips. In yet another embodiment, the conformal reflective layer of inorganic particles can be covered by a curable transparent matrix material comprising one or more highly reflective materials dispersed, distributed, and/or suspended therein. In certain aspects, the transparent matrix is a two-part, curable formulation. In such aspects, the one or more of highly reflective material can be introduced to either or both of the two-part portions, provided that it does not substantially affect the curing of the matrix. Thus, for example, a predetermined amount of titanium dioxide can be added to one part of a two-part curable silicone resin to provide a precursor formulation suitable for use as described below. In another aspect, the transparent matrix can be introduced to the substrate or submount and be deposited directly on the conformal reflective layer.

The transparent matrix with reflective material and methods of depositing and arranging same, includes by way of incorporation by reference herein in their entirety, co-assigned U.S. Patent Publication No. 2012/0193647, and U.S. application Ser. No. 13/554,628. LED Packages with Distribution of Inorganic Particles In one embodiment, the LED package comprises a plurality of LED elements post die attached and wire bonded, the distribution of inorganic particles covering at least a portion of the substrate or submount and at least partially surrounding the LED elements. In another aspect, the LED package comprises a plurality of LED elements post die attached and wire bonded, the distribution of inorganic particles covering at least a portion of the substrate or submount and touching the LED elements. As discussed further below, such configurations, the conformal layer comprising the distribution of inorganic particles is substantially prevented from covering the light emitting surface(s) of the LED element(s) while substantially covering light-absorbing structure and/or elements present on or of the substrate. In one aspect, the distribution of inorganic particles can be configured to be essentially planar with the top surface of the LED element(s) so as to improve secondary optics, for example. In another aspect, the distribution of inorganic particles can be configured to be essentially vertical with the side surface of non-LED element(s), for example, metal contacts, ESD's, wiring, etc. These configurations, alone or in combination, provides LED packages with enhanced brightness by increasing the amount of reflected light compared to a LED package without the conformal layer comprising the distribution of inorganic particles herein disclosed. In other aspects, the conformal layer comprising the distribution of inorganic particles is non-planar (arced or tapered) and/or does not completely surround and/or reach the highest vertical height of one or more of the light-absorbing elements present on the surface of the LED package.

In other aspect, the LED package comprises a plurality of LED elements (arrays) post die attached and wire bonded, or the LED package comprises a "flip-chip" architecture, wherein the conformal reflected layer comprising the distribution of inorganic particles covers the substrate or submount and optionally at least a portion of the sidewalls of the non-LED elements and channels between the array elements. This configuration provides LED packages with enhanced brightness by increasing the amount of reflected light relative to a LED package post die attached and wire bonded without the distribution of inorganic particles herein disclosed.

The conformal reflective layer comprising a distribution of reflective inorganic particles can consist essentially of inorganic particles, wherein "consisting essentially of" refers to essentially a distribution of inorganic particles without blinders, polymer matrices, adhesives, residual organic solvent, and the like, excluding flocculants, dispersants, and impurities of other naturally present components such as other minerals or inorganic compounds typically present in the raw materials and/or production of the reflective inorganic materials. In one aspect, such flocculants, dispersants, and impurities (total) account for no more than 25%, no more than 15%, no more than 10%, or no more than 1% by weight of the total weight of the reflective inorganic material. Flocculants, dispersants, and impurites of the reflective inorganic particles are exclusive of transparent polymer matrices.

Referring to FIG. 1, the top surface of a conventional submount 64 is shown having planar surface with patterned conductive features 68 that can include die attach pads 70 and interconnecting conductive traces 72. These features 68 provide conductive paths for electrical connection to the LED chips 62 using known contacting methods. Each of the LED chips 62 (not shown) can be mounted to a respective one of the attach pads 70 using known methods and material mounting using conventional solder materials that may or may not contain a flux material. The LED chips 62 can similarly be mounted and electrically connected to the conductive traces 72 using known surface mount or wire bonding methods depending on the geometry of the LED chips 62. Alternatively, flip chip LEDs can be mounted as described above on the attach pads and conductive traces. The attach pads 70 and interconnecting traces 72 can comprise many different materials, such as metals or other conductive materials, and in one embodiment they can comprise copper deposited using known techniques a finish of Ag plating to enhance brightness.

Figure 2:
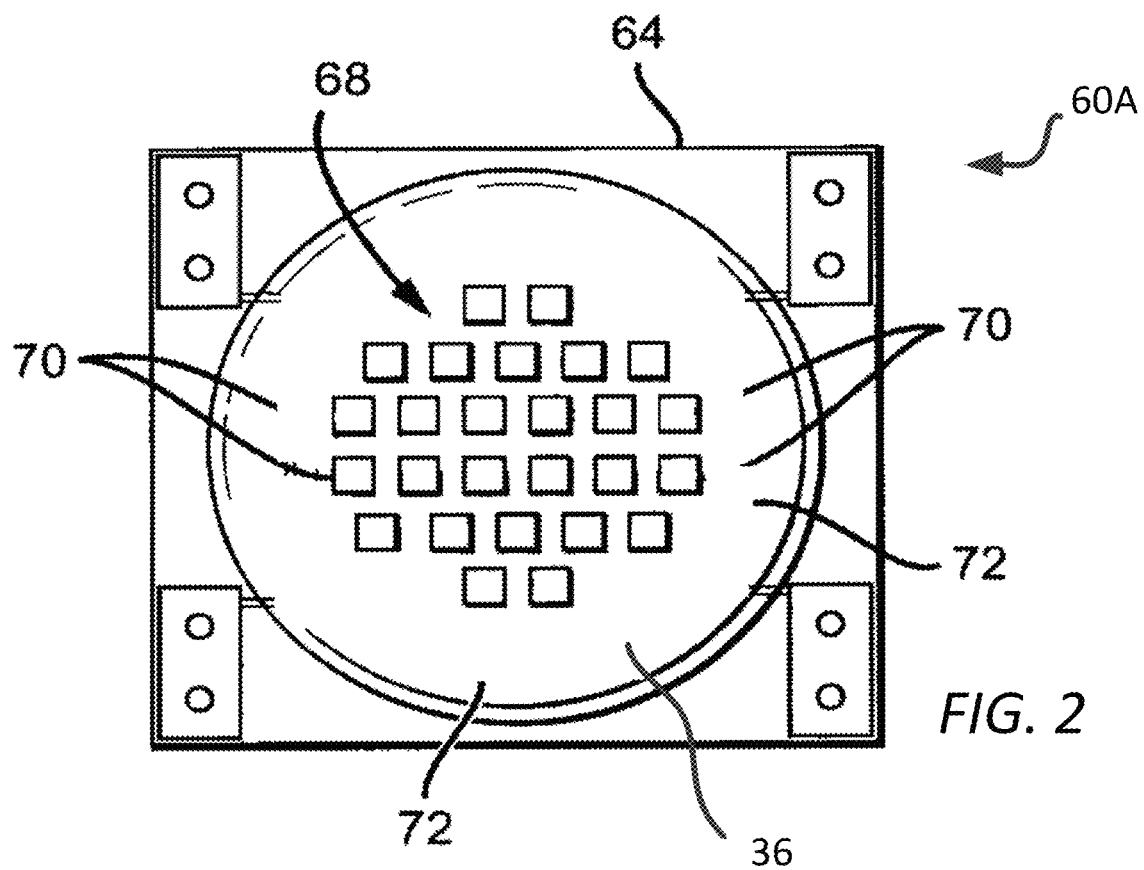
FIG. 2 is a top plan view of an embodiment of the LED component of FIG. 1 according to an embodiment of the present disclosure.

Referring now to FIG. 2, the top surface of the submount 64 according to the present disclosure is shown having planar surface with conformal reflective layer 36 covering its patterned conductive features 68 that can include die attach pads/ESD's (not shown) and interconnecting conductive traces 72. Each of the LED chips 62) preferably can be pre-mounted and/or wire bonded to a respective one of the attach pads using known methods and material mounting using conventional solder materials that may or may not contain a flux material. The LED chips can similarly be pre-mounted and electrically connected to conductive traces using known surface mount or wire bonding methods depending on the geometry of the LED chips 62 prior to introduction and/or forming of the conformal reflective layer 36. The conformal reflective layer 36 can be configured to provide essentially a planar surface of the distribution of inorganic particles 36 as described above. In one aspect, the array comprises flip chip LEDs mounted as described above on the attach pads and conductive traces.

The LED chips 62 are preferably mounted on a substantially planar surface of the submount 64 and may be arranged under a single optical lens element. In other embodiments, the LED chips can be mounted on a non-planar substrate or submount. In the embodiment shown, the component 60A can be configured to emit white light at a desired color point and color rendering index as a combination of light from the various LEDs, and simultaneously emits a predetermined luminous flux at high efficacy. Use of the conformal reflective layer 36 in this configuration allows for light that otherwise would be absorbed to be reflected, providing a net gain in total luminous flux for the LED package.

For example, the LED chips 62 can be coated with one or more phosphors with the phosphors absorbing at least some of the LED light and emitting a different wavelength of light such that the LED emits a combination of light from the LED and the phosphor. In one aspect, one or more phosphors can be compounded with the distribution of inorganic particles. For example, the one or more phosphors can be included in the transparent matrix together with the highly reflective material. In one aspect, the reflective coating is introduced to the substrate and is configured to reflect light from the LED and light from phosphor particles that otherwise would be absorbed, back towards the substrate. In one aspect, a dry-caked-powder-like $TiO_2$ substrate floor is provided, which is optionally contacted by a transparent silicone matrix and or the silicone+phosphor matrix, a portion of the silicone matrix weeping down through some or all of $TiO_2$ substrate floor to provide adhesion of the $TiO_2$ particles to the substrate.

In another aspect, the organic suspension of reflective inorganic material, e.g., $TiO_2$ in xylene, in introduced to a substrate or submount having the transparent matrix present. In this method, some of the $TiO_2$ particles can be introduced into the transparent silicone upon contact with the organic solvent. In this advantageous example, the $TiO_2$ particles are introduced to the transparent silicone in a gradient-like manner (e.g. more concentrated at the top of the transparent matrix where they will provide improved reflection as a result), in a higher concentration and in closer proximity to the light emitting elements as compared with a transparent matrix having reflective material pre-compounded therein.

Depending on the method used for releasing the LED-covering layer, e.g., having the substrate right-side-up may have (or leave) loose $TiO_2$ on the surface, whereas using the Top-side-down removal method may have loose $TiO_2$, that is present on or about the LED-coating layer, released) to fall free from the substrate and not be left on the substrate, providing minimal loss of the $TiO_2$ compound.

In other aspects, each of the LED chips 62 can be coated with one or more color shifting elements and employed in combination with the conformal reflective layer 36. In yet another aspect, the LED chips 62 can be coated with one or more phosphors and the conformal reflective layer 36 comprising distribution of inorganic particles can be employed together with the transparent matrix comprising reflective material applied about the phosphor coating, the transparent matrix can optionally further comprise one or more phosphors. Generally you do not want to direct light back into an epitaxial layer, which is typically very absorbing, or have converted light bounce around the LED package any more than necessary. Thus reflective-material would generally not be positioned directly above an epitaxial layer or above a phosphor layer in any appreciable quantity so as not to be reflected light in a direction where it can be absorbed, or in the wrong direction. In one aspect, combination of the clock formal letter, transparent matrix, and phosphor is configured such that the phosphor particles, which are an order of magnitude bigger than the $TiO_2$ particles, will settle beneath the $TiO_2$ which is what one wants.

In one exemplary embodiment according to the present disclosure, the LED chips 62 are configured to provide a resultant white light, e.g., cool white or warm white. For example, LEDs chips 62 can have an LED that emits light in the blue wavelength spectrum and the phosphor absorbs some of the blue light and re-emits yellow, with the LED chips 62 emitting a white light combination of blue and yellow light. In one embodiment, the phosphor comprises commercially available YAG:Ce, although a full range of broad yellow spectral emission is possible using conversion particles made of phosphors based on the $(Gd,Y)_3(Al,Ga)_5O_{12}$:Ce system, such as the $Y_3Al_5O_{12}$:Ce (YAG). Other yellow phosphors that can be used for white emitting LED chips include, for example: $Tb_{3-x}RE_xO_{12}$:Ce(TAG); RE=Y, Gd, La, Lu; or $Sr_{2-x-y}Ba_xCa_ySiO_4$:Eu.

The LED chips 62 can be configured for emitting red light, for example, they can comprise LED structures and materials that permit emission of red light directly from the active region. Alternatively, in other embodiments, the LED chips 62 can comprise LEDs covered by a phosphor that absorbs the LED light and emits a red light. Some phosphors appropriate for these structures can comprise, for example: Red $Lu_2O_3$:Eu$^{3+}$($Sr_{2-x}La_x$)($Ce_{1-x}Eu_x$)$O_4$ $Sr_2Ce_{1-x}Eu_xO_4$ $Sr_{2-x}Eu_xCeO_4$ $SrTiO_3$:Pr$^{3+}$,Ga$^{3+}$ $CaAlSiN_3$:Eu$^{2+}$ $Sr_2Si_5N_8$:Eu$^{2+}$. Other structures, arrangements, and combinations of single and/or multi-color LED-phosphor chips can be employed to provide a desired lighting effect, as is generally known in the art. Spectral notch compounds can be included in the lighting package or optical components, on the LED elements, or in the transparent matrix. Spectral notch compounds include, for example, rare-earth metal compounds, e.g., compounds of neodymium, didymium, dysprosium, erbium, holmium, praseodymium and thulium, such as their oxides, halogens, nitrates, acetates, hydroxides, phosphates, sulfates, and hydrates thereof, for example, neodymium(III) nitrate hexahydrate ($Nd(NO_3)_3.6H_2O$); neodymium(III) acetate hydrate ($Nd(CH_3CO_2)_3.xH_2O$); neodymium(III) hydroxide hydrate ($Nd(OH)_3$); neodymium(III) phosphate hydrate ($NdPO_4.xH_2O$); neodymium(III) carbonate hydrate ($Nd_2(CO_3)_3.xH_2O$); neodymium(III) isopropoxide ($Nd(OCH(CH_3)_2)_3$); neodymium(III) titanante ($Nd_2O_3.xTiO_2$); neodymium(III) chloride hexahydrate ($NdCl_3.6H_2O$);

neodymium(III) fluoride (NdF$_3$); neodymium(III) sulfate hydrate (Nd$_2$(SO$_4$)$_3$.xH$_2$O); neodymium(III) oxide (Nd$_2$O$_3$); erbium(III) nitrate pentahydrate (Er(NO$_3$)$_3$.5H$_2$O); erbium (III) oxalate hydrate (Er$_2$(C$_2$O$_4$)$_3$.xH$_2$O); erbium(III) acetate hydrate (Er(CH$_3$CO$_2$)$_3$xH$_2$O); erbium(III) phosphate hydrate (ErPO$_4$.xH$_2$O); erbium(III) oxide (Er$_2$O$_3$); Samarium(III) nitrate hexahydrate (Sm(NO$_3$)$_3$.6H$_2$O); Samarium (III) acetate hydrate (Sm(CH$_3$CO$_2$)$_3$.xH$_2$O); Samarium(III) phosphate hydrate (SmPO$_4$.xH$_2$O); Samarium(III) hydroxide hydrate (Sm(OH)$_3$.xH$_2$O); samarium(III) oxide (Sm$_2$O$_3$); holmium(III) nitrate pentahydrate (Ho(NO$_3$)$_3$.5H$_2$O); holmium(III) acetate hydrate ((CH$_3$CO$_2$)$_3$Ho.xH$_2$O); holmium (III) phosphate (HoPO$_4$); and holmium(III) oxide (Ho$_2$O$_3$). Other rare earth metal compounds, including organometallic compounds of neodymium, didymium, dysprosium, erbium, holmium, praseodymium and thulium can be used.

The submount 64 can be formed of many different materials with a preferred material being electrically insulating, such as a dielectric element, with the submount being between the LED array and the component backside. The submount can comprise a ceramic such as alumina, aluminum nitride, silicon carbide, or a polymeric material such as polyimide and polyester etc. In the preferred embodiment, the dielectric material has a high thermal conductivity such as with aluminum nitride and silicon carbide.

In other aspects of the above embodiments, the submount 64 can also comprise or be constructed of highly reflective material, such as reflective ceramic (very pure aluminum oxide, sapphire, etc.) or metal layers like silver, to enhance light extraction from the component and/or complement the conformal reflective layer 36.

In other embodiments the submount 64 can comprise a printed circuit board (PCB), alumina, sapphire or silicon or any other suitable material, such as T-Clad thermal clad insulated substrate material, available from The Bergquist Company of Chanhassen, Minn. For PCB embodiments, different PCB types can be used such as standard FR-4 PCB, metal core PCB, or any other type of printed circuit board.

The surface of the submount 64 can be pre-treated with adhesion promoters and/or coupling agents known in the art to improve the adhesion of the conformal reflective layer 36 to the surface of the submount, sides/edges of the LED chips providing that such adhesion methods do not substantially degrade the performance of the LED elements or package.

It is understood that LED components according to the present disclosure can be fabricated using a method that incorporates submount panel or wafer comprising a plurality of submounts. Each of the submounts 64 can be formed with its own array of LEDs and optical elements 66 such that multiple LED chips 62 can be formed across the submount panel. Multiple LED chips 62 can then be singulated from the submount panel. Each submount 64 may also comprise a more complex combination of elements such as a plurality of "submount" assemblies which are mounted on a planar surface of submount. The submount assemblies can have different functionalities such as providing electrostatic discharge (ESD) protection for the various LED chips. In such embodiments, the conformal reflective layer 36 can be employed as described above so that the conformal reflective layer 36 essentially surrounds the LED chips and is flush with the light-emitting surface(s) of the LED chips.

The size of the submount 64 in LED package 60 can vary depending on certain factors such as the size and number of LEDs. In one embodiment, the sides of the submount can be approximately 12 mm by 13 mm. It is further understood that the submount 64 can have other shapes including circular, oval, rectangular, hexagonal or other multiple sided shapes.

Figure 3:
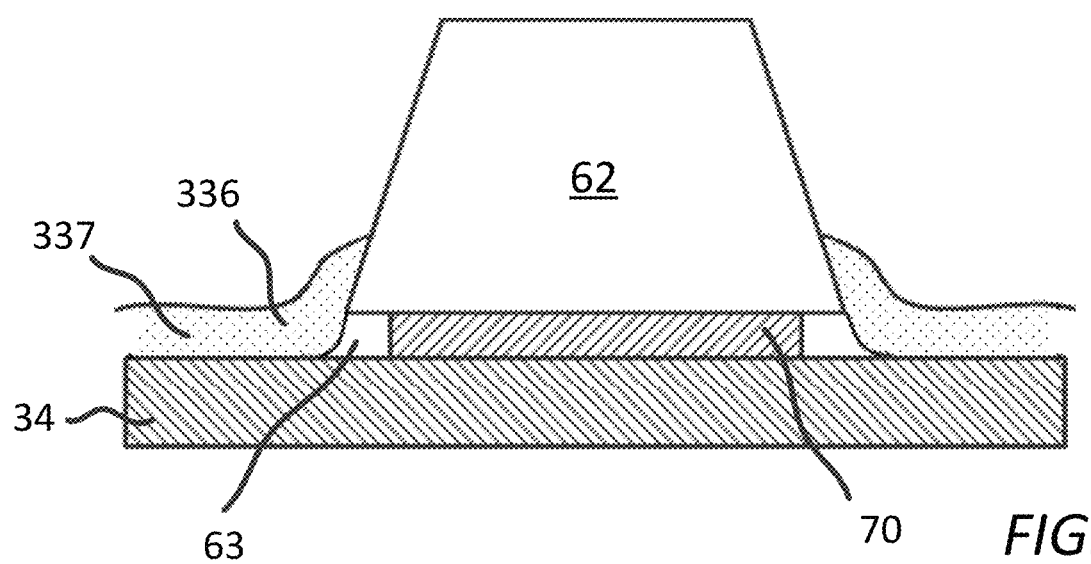
FIG. 3 is a cross-sectional view of an LED packaging element comprising a reflective coating that includes a transparent matrix and reflective material.

FIG. 3 depicts a contemporary flip chip LED package having a single, beveled-edge LED chip 62 and a transparent matrix 336 containing reflective material 337 having been deposited on substrate 34. By virtue of the viscosity and other factors, transparent matrix 336 "creep" up in the long an edge of the LED chip 62, which, if chip 62 overhangs metal contact or die pad 70, gaps 63 may form, exposing portions of the substrate. Gap 63 can result when the overhang of LED 62 extends 5 to 15 micron (µ) from contact or pad, the vertical height of the contact or pad being generally about 5 to 15µ in height. When the contact or pad height is reduced even further with overhang from the LED, the likelihood of the gap forming increases. While this configuration may provide an increase in luminous output compared with a similar LED package without such reflective material, the present disclosure provides, in one aspect, a significant improvement to the above configuration. The majority of the loss from this configuration can be attributed to the reflective material that is present on the light emitting sidewall of the device that may increase light recirculation within the LED, and likely increased absorption. Thus, gap 63 is less important than the conformal layering of the sidewall feature 337.

Figure 4:
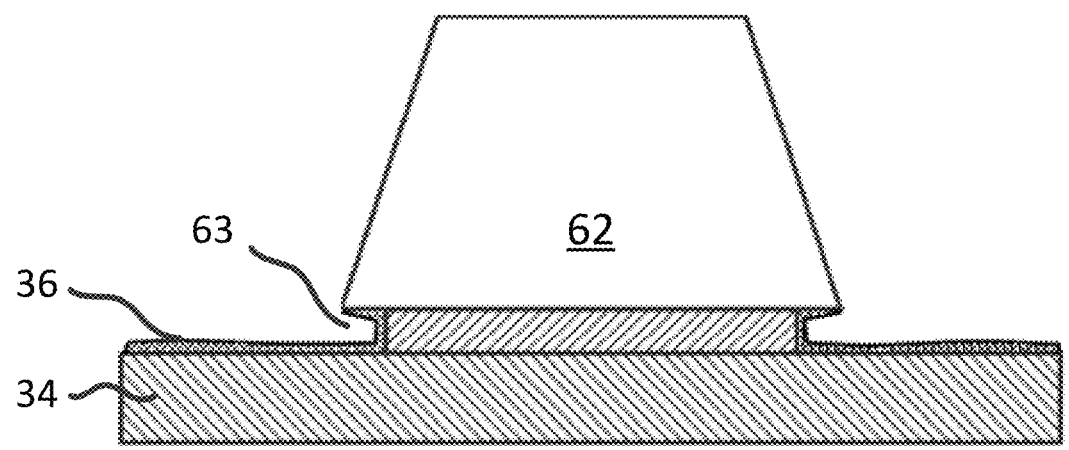
FIG. 4 is a cross-sectional view of an LED packaging element according to an embodiment of the present disclosure.

Thus, FIG. 4 depicts an exemplary flip chip LED package in accordance with the present disclosure having a single, beveled-edge LED chip 62 and conformal reflective layer 36 positioned on the surface of substrates 34. Where LED 62 overhangs contact or pad 70, conformal reflective coating 36 deposited in accordance with the methods herein disclosed provides both horizontal and vertical attachment to surfaces present about LED 62. In this exemplary aspect, the conformal reflective layer 36 essentially surrounds light-absorbing surfaces around the LED chip 62 and about the gap 63, and is flush with the lower light emitting edge or surface of the LED chip 62 and side of metal contact or pad 70, while essentially covering substrate 34. In some aspects, the conformal coating can be present and cover a small total surface area on the top surface or other light emitting surface. Small total surface area is a relative term, for example, small total surface area on the top surface or other light emitting surface is between 0 and 10%, between 0 and 5%, or between 0 and 1%.

Figure 5:
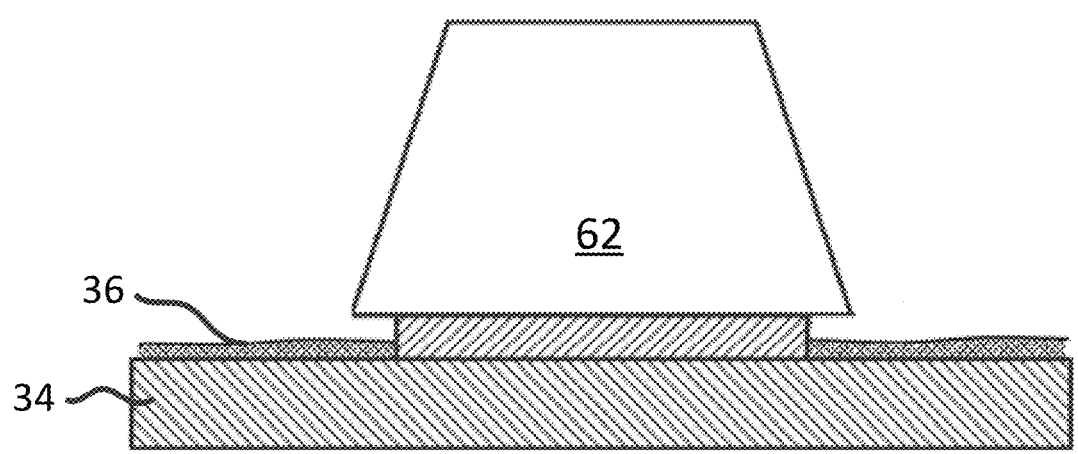
FIG. 5 is a cross-sectional view of an LED packaging element according to an alternate embodiment of the present disclosure.

FIG. 5 depicts an alternate exemplary flip chip LED package in accordance with the present disclosure having a single, beveled-edge LED chip 62 and conformal reflective layer 36 positioned on the surface of substrates 34, similar to that depicted in FIG. 4, without vertical attachment of the conformal reflective layer 36.

Figure 6A:
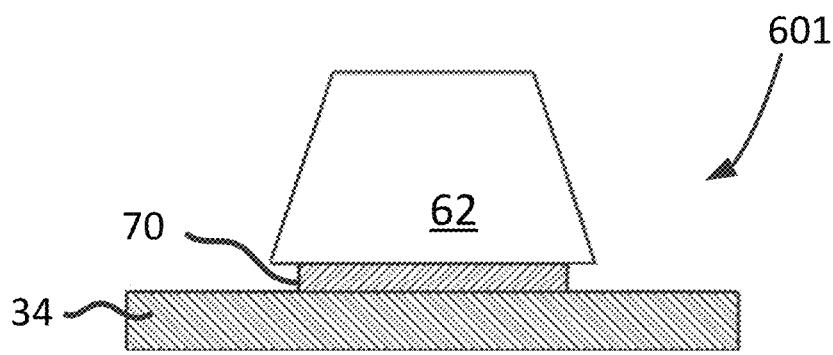
FIGS. 6A, 6B, and 6C depict a method embodiment of the present disclosure.
Figure 6B:
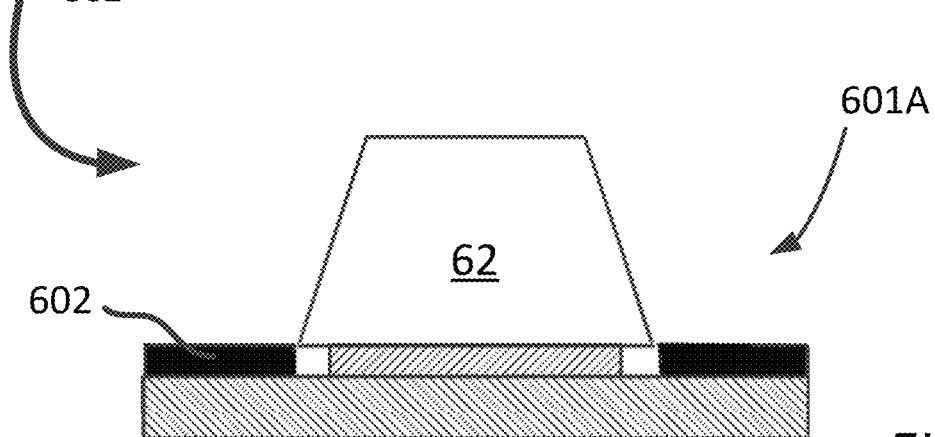
Figure 6C:
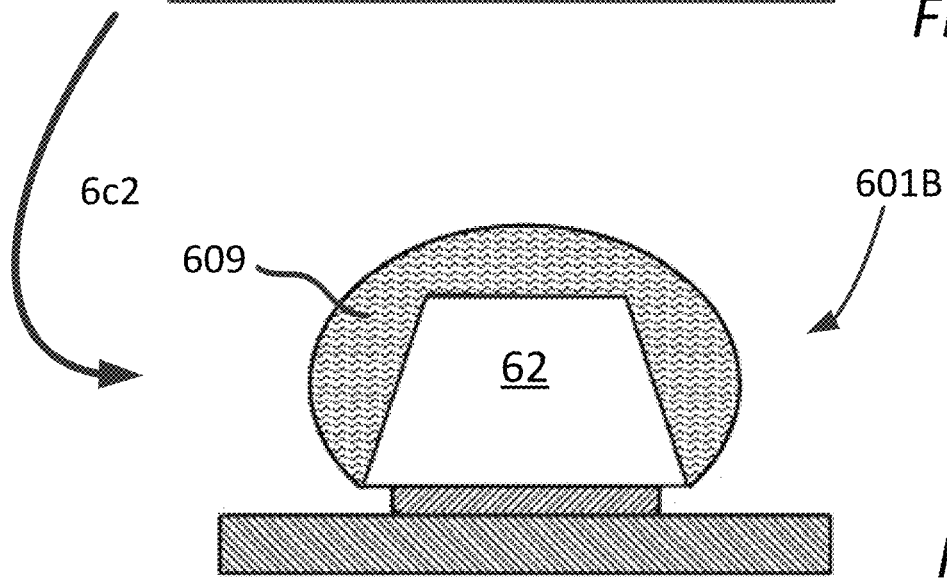

FIGS. 6A, 6B, and 6C depict a method embodiment of the present disclosure whereby LED elements are masked prior to contact by the conformal reflective layer 36. Thus, in step 6c1, all or a portion of LED package 601 is presented with mask 602 (which can be a mask suitable for screen printing) covering substrate 34 providing LED package 601A. In step 6c2, LED-covering layer 609 is presented to substrate 34 having mask 602 so as to cover LED element 62. Removal of mask 602 in step 6c2 provides LED-protected element 601B, which can be subsequently introduced to precursor solution for providing conformal reflective layer 36.

Figure 7A:
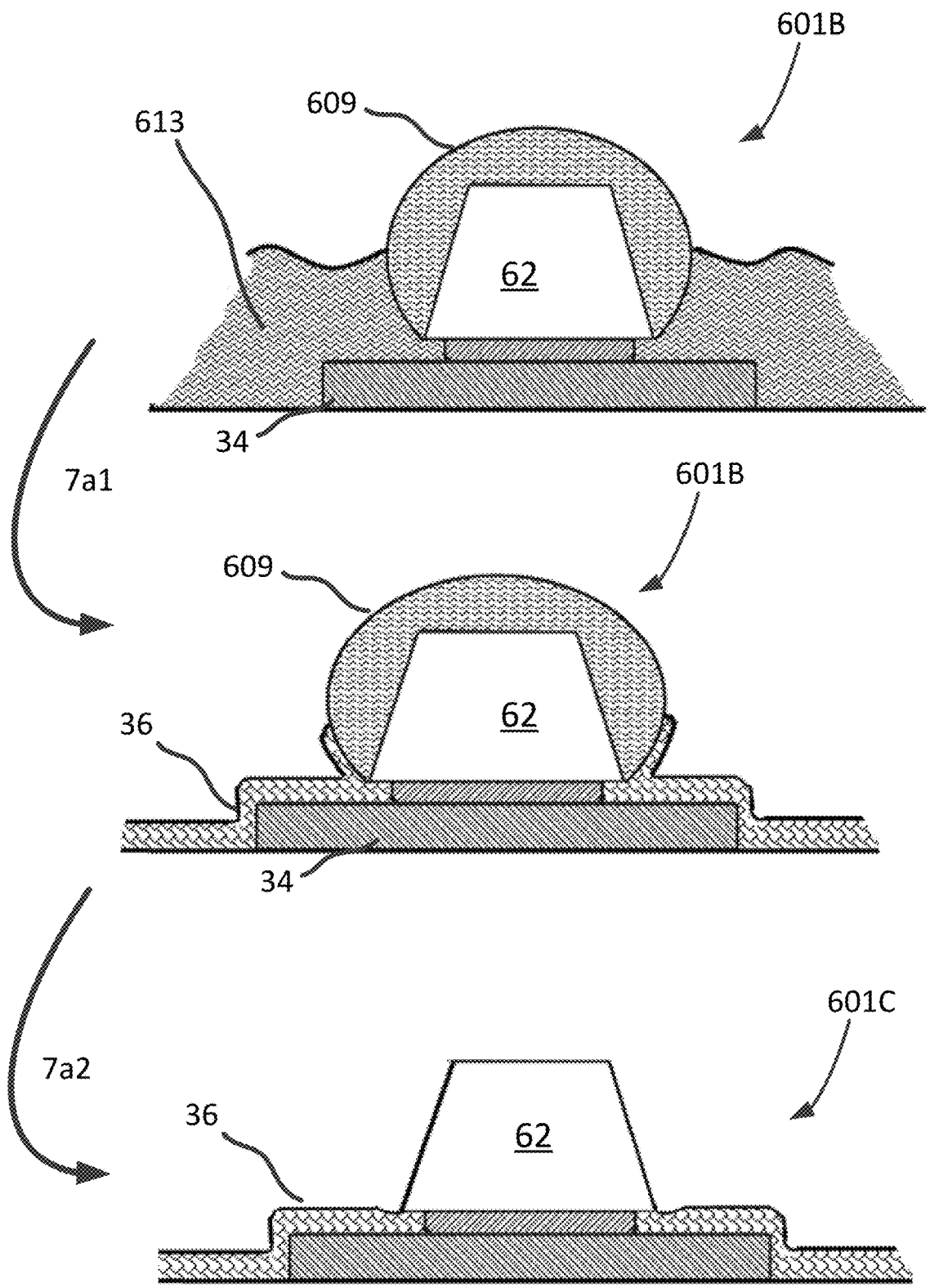
FIG. 7A is a method embodiment of the present disclosure.

Thus, referring now FIG. 7A, a method of providing the conformal coating is depicted, where LED package element 601B is contacted with precursor solution 613 comprised of organic solvent comprising inorganic particulate material that is suspended, dispersed, and/or distributed therein.

Contacting the packaging element 601B can result in some or all of the top of the chips (where top is the maximum vertical height and/or light emitting surface relative to the substrate/submount it is bound to) being covered and/or ultimately conformally coated. Organic solvent precursor solution 613 is chosen to minimize interaction or dissolution of LED covering layer 609. Step 7a1 involves evaporating organic solvent (e.g., with heat, vacuum, and/or moving air) so as to provide conformal reflective coating 36, which is essentially an agglomeration or distribution of reflective inorganic particles adhering to the substrates 34 and/or any other vertical or horizontal surfaces of the LED package. As shown, Step 7a1 provides reflective inorganic particles of conformal layer 36 on at least a portion of the side of protective covering layer 609 but away from LED 62. Reflective inorganic of conformal layer 36 particles are conformably present along the vertical sidewall of the LED attach metal 70. Basically, anywhere that precursor solution 613 has contacted (e.g., the "water-line"), conformal layer 36 is deposited. During the release/develop of covering layer 609, inorganic particles of conformal layer 36 will fall away/wash away with covering layer 609 and substantially not be present on the chip.

Still referring to FIG. 7 in step 7a2, an aqueous-based developer system is employed to remove LED covering layer 609 so as to provide LED package similar to that shown in either FIG. 4 or 5.

Figure 7B:
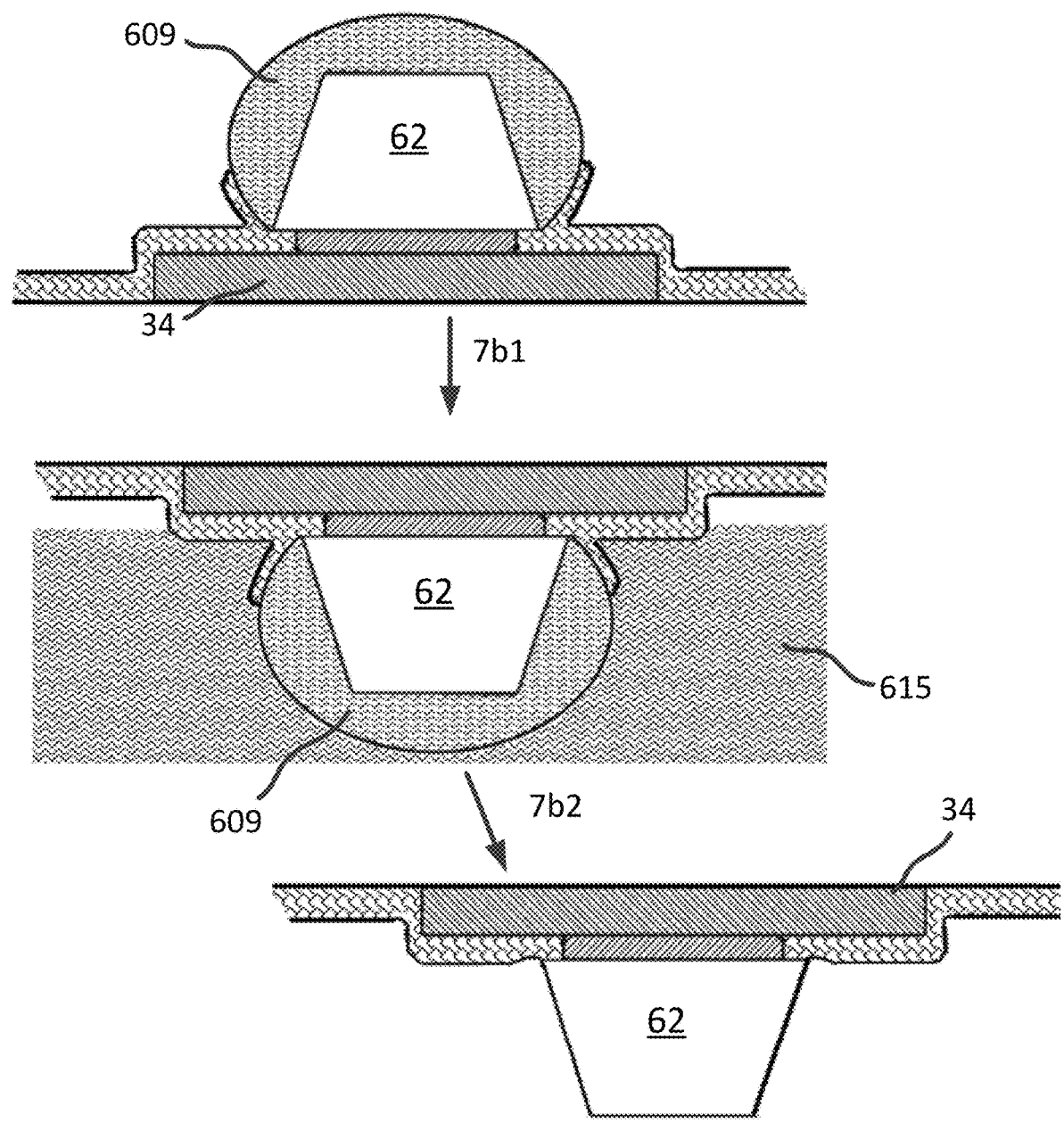
FIG. 7B is a method embodiment of the present disclosure.

Referring now to FIG. 7B, an alternate method step to that of Step 7a2 is provide, where, as shown by Step 7b1, configuration 601b (as depicted in FIG. 7B) is inverted and contacted with developer 615, which can be water or an aqueous solution e.g., a mixture of water and one or more of alcohols, glycols, ethers, esters, acetone, ketones, etc., for removal of the covering layer 609, for example, to reduce or eliminate re-depositing portions of conformal layer 36 adhering to cover layer 609.

Figure 7C:
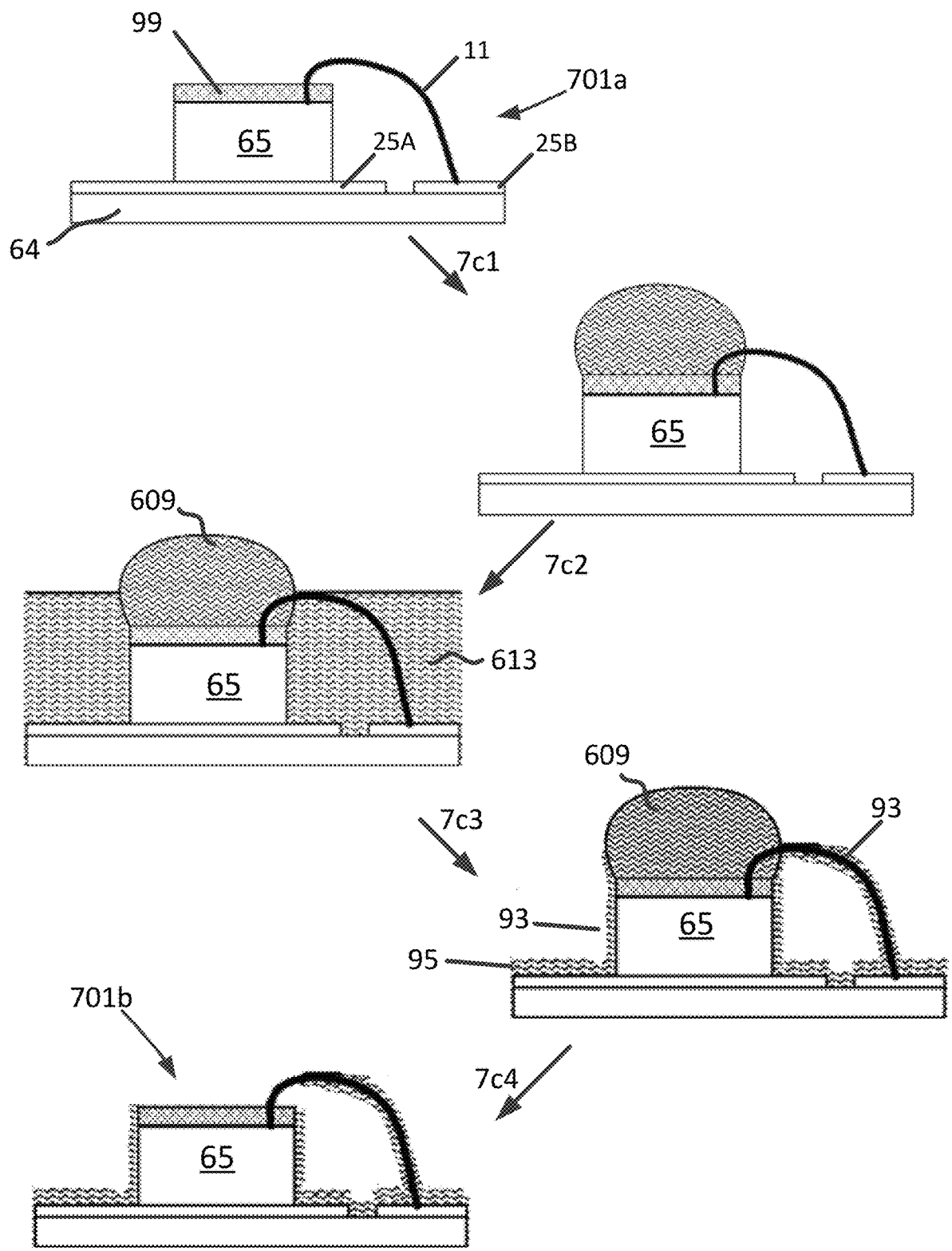
FIG. 7C is a method embodiment of the present disclosure.

FIG. 7C depicts a similar methodology for a surface mounted LED element 65, having bonding pads 25A, 25B on substrate 64. Substrate 64 can be rigid or flexible and can be FR4 printed circuit board (PCB). As shown in Step 7c1, configuration 701a is provided LED covering layer 609 as described above. Step 7c2 provides for contact of the covered LED with organic solvent precursor solution 613, Step 7c3 provides for evaporation of the organic solvent to provide conformal coating 93, 96, where sidewall-adhering coating 93 and other vertical structure, such as wire 11, have a slightly thinner coating than horizontal surfaces, such as substrate 64, which has relatively thicker conformal coating 95. Step 7c4 provides for removal of cover layer 609 as described above.

Figure 8:
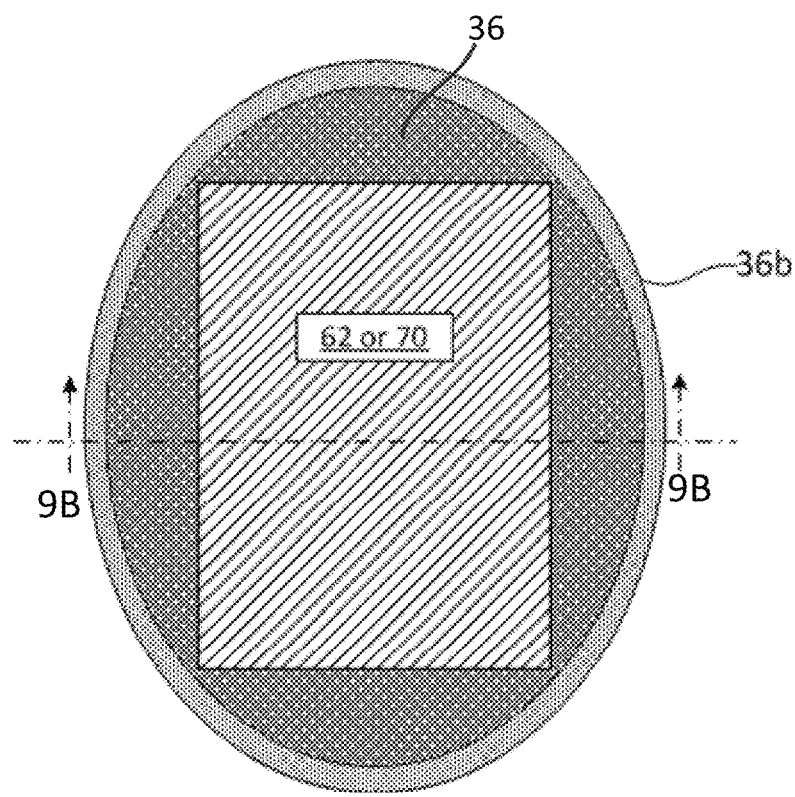
FIG. 8 is a top plan view of an embodiment of an LED component package according to the present disclosure.

FIG. 8 depicts, by way of example, a top plan view of FIG. 7C (or LED or metal contact) further having a shaped layer of transparent matrix 36b with reflective material covering the conformal reflective layer 36, for example, an annular-like shaped transparent matrix 36b, about the respective perimeters of pad 70 (or LED 62). One aspect is shown, where layer 36b completely surrounds the perimeter of pad 70 or of LED 62. Some spacing between pad 70 and layer 36b is tolerable, as well as conformal layer 36 being outside of layer 36b so as to assure that all floor surfaces are essentially 100% highly reflective within the index matched region.

Figure 9A:
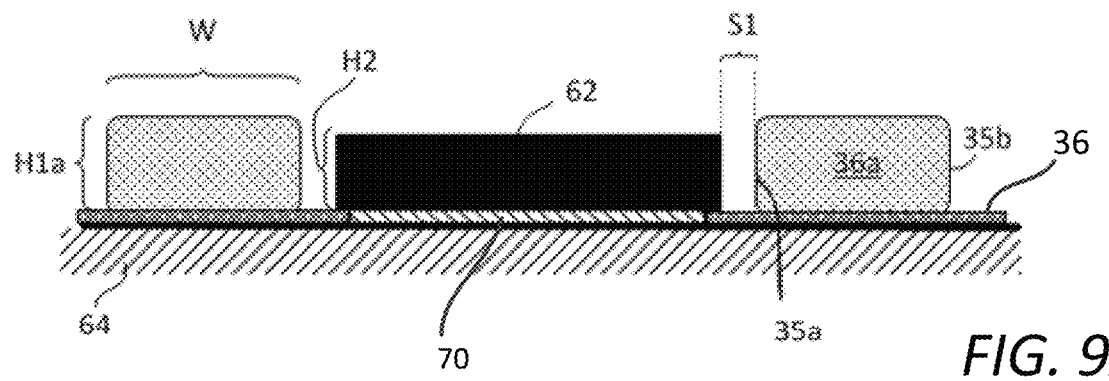
FIGS. 9A, 9B, and 9C are sectional views of an embodiment of an LED component according to the present disclosure.

Referring now to FIG. 9A, cross sectional views of substrate/LED/conformal reflective layer is shown with an exemplary shaped transparent matrix 36a about LED 62 mounted on die attach pad 70 (or metal contact. FIG. 9A depicts transparent matrix layer 36a deposited on conformal reflective layer 36, transparent matrix layer 36a being of generally or substantially polygonal shape with height H1a less than, equal to, or greater than LED 62 height H2, which can include the height of pad 70 including conformal reflective layer 36. Layer 36a has an inner surface 35a in proximity to LED 62 and outer surface 35b in further proximity to LED 62 than that of inner surface 35a. Thus, the predetermined shape of layer 36a has a first surface (e.g., 35a) projecting from layer 36 and in proximity to LED element 62, and a second surface (e.g., 35b) projecting from layer 36 and in further proximity to LED element 62 than the first surface. Polygonal-like shape is inclusive of square and rectangle shapes with straight, curved or unequal lengths and/or angles defining the lengths.

Figure 9B:
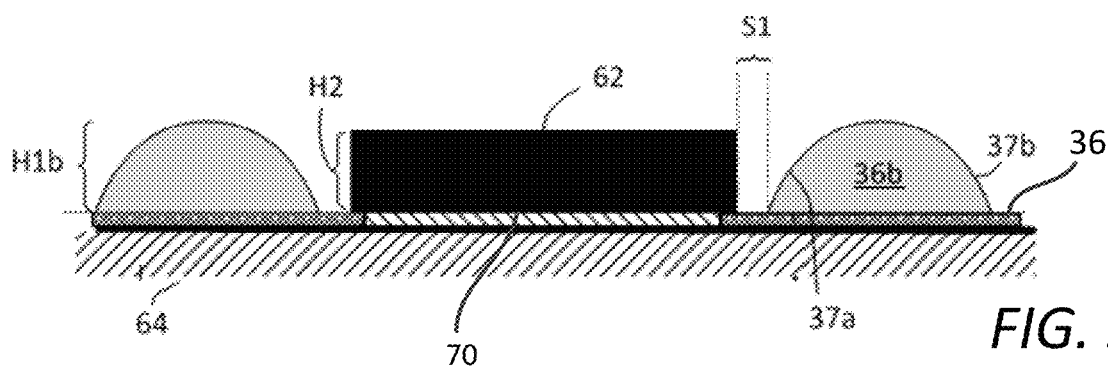

Referring now to FIG. 9B, which is a cross sectional view along line 9B-9B of FIG. 8, depicting substrate/LED/conformal reflective layer is shown with an exemplary transparent matrix 36b shaped about LED 62 or metal contact. FIG. 9B depicts layer 36b of a generally annular-like shape, with height H1b equal to or greater than LED 62 height H2, which can include the height of pad 70 and conformal reflective layer 36. Layer 36b has an inner surface 37a in proximity to LED 62 and outer surface 37b in further proximity to LED 62 than that of inner surface 37a. Annular-like is inclusive of ring or oval shapes and such shapes including linear sections.

Figure 9C:
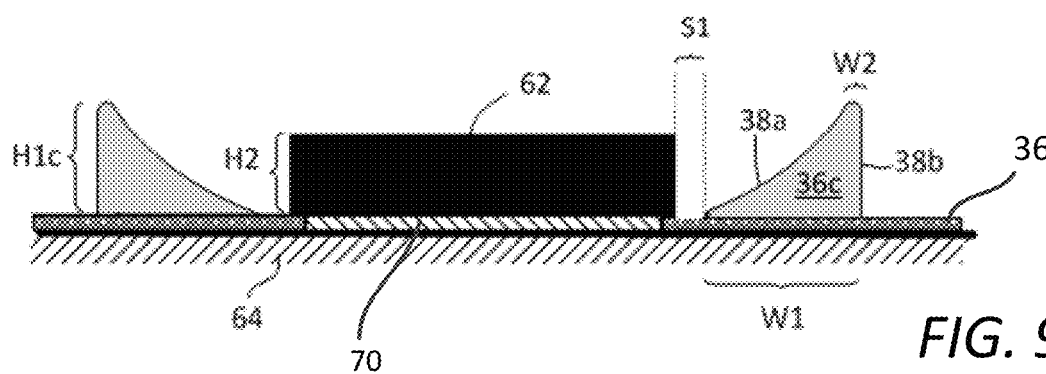

With reference to FIG. 9C, and alternate arrangement of transparent matrix 36c is depicted. Space S1 between the corresponding inner surface of layers 36a, 36b, and 36c can be reduced such that at least a portion of the corresponding inner surface touches LED 62, or enlarged such that no portion of the corresponding inner surface touches LED 62, or portions of layer touches LED 62 and portions do not touch LED 62. In another aspect, space S1 between the corresponding inner surface of layers 36a, 36b, and 36c can be reduced such that the corresponding inner surface touches LED 62 and extends a height above that of LED height H2. Width W (along substrate 64) can be predetermined based on the density of die attachment pads (not shown) and/or LED 62 used. In one aspect, W is less than the distance between die attachment pads and/or LED 62, e.g., some portion of substrate 64 is not covered by layer 36. In other aspects, layer 36a, 36b, and 36c can physically contact or at least partially touch the LED along a vertical edge thereof. In another aspect, layer 36a, 36b, and 36c can be physically separated from the LED along a vertical edge thereof.

Methods of Forming LED Packages with Conformal Reflective Coating

An embodiment of the present disclosure is directed to application of the conformal reflective layer comprising the distribution of inorganic particles on many different LED chip arrangements. In other aspects, application of the conformal reflective layer on many different LED chip arrangements with the individual LED chips either coated by a converting phosphor or emitting light directly from their active region, are provided. In one alternative embodiment, a single or plurality of series connected LED chip circuits can comprise LED chips wherein all are coated with a single down-converting material. The mixed emission from the LED and the down-converting material can be cool or warm light. In one embodiment, all the LED chips emitter are blue LEDs covered with phosphor, however, other configurations can comprise different LED chips with LEDs emitting at different wavelengths and phosphors. Another embodiment can comprise a single or plurality of series connection LED circuits, with all the LED chips comprising LEDs comprising two or more down-converting materials like a phosphor, the substrate of which is coated with and/or containing the conformal reflective layer 36. The combined LED and phosphor emission can cover different spectral ranges such as blue, green, yellow and red spectral ranges. The mixed emission can be cool or warm white light with a color point on the black body locus or within an 8-step Mac Adam ellipse thereof with high color rendering index of greater than 85. The phosphor composition can be for example selected from materials discussed above and/or combined with the distribution of inorganic particles.

It is understood that the LED chips in the arrays including the distribution of inorganic particles as herein disclosed and described can be arranged as one or more multiple multi-chip LED lamps as described in U.S. Patent Publication No. 2007/0223219 entitled "Multi-Chip Light Emitting Device for Providing High-CRI Warm White Light and Light Fixtures Including the Same", the disclosure of which is incorporated by reference.

In still other embodiments of an LED component according to the present disclosure can comprise a plurality of series connection circuits comprising LED chips that emit light directly from their active region, with at least one series circuit provided for red, green and blue emitting LEDs, respectively. In other embodiments series connected LEDs circuits can also be added emitting cyan, yellow and/or amber. The LED component preferably emits a white light combination of light from the series circuits that has a high color rendering index of greater than 85, greater than 90, or greater than 95. The composition of the inorganic particles of the con formal reflective layer can be chosen to maximize reflection of a corresponding wavelength of light from such an array of LED chips.

For example, in any of the LED chip configurations above in which at least one of the emitters comprises a short wavelength emitter in conjunction with one or more phosphor emitters, an ultraviolet emitting LED can be used as the LED. This results in the predominant emission component of the LED chips coming from the phosphor excited by the ultraviolet LED. The phosphor emitter can be included in the transparent matrix or applied to the package separately in combination with the distribution of inorganic particles. By way of example, each of the following phosphors exhibits excitation in the UV emission spectrum, provides a desirable peak emission, has efficient light conversion, and has acceptable Stokes shift, for example: Yellow/Green: $(Sr,Ca,Ba)(Al,Ga)_2S_4:Eu^{2+}$ $Ba_2(Mg,Zn)Si_2O_7:Eu^{2+}$ $Gd_{0.46}Sr_{0.31}Al_{1.23}OxF_{1.38}:Eu^{2+}{}_{0.06}(Ba_{1-x-y}Sr_xCa_y)SiO_4$: Eu $Ba_2SiO_4:Eu^{2+}$.

The LED components according to the present disclosure are particularly applicable to integration is solid state lighting luminares, and provide for surface mount or wire bond mounting in the luminares. The LED components provide an improvement in the lumens provided per cost, due to the reduced assembly requirements and footprint in luminaries along with reduced driver costs. The use of the conformal reflective layer comprising the distribution of inorganic particles in accordance with the present disclosure provides for improved luminous flux and can be achieved with low cost materials and minimum additional manufacturing costs.

The distribution of inorganic particles is introduced to a previously post die attached (and optionally wire bonded LED element(s) with optional subsequent formation of a metal reflective element. And organic solvent-based solution comprising reflective inorganic particles are introduced to the substrate with subsequent evaporation of the organic solvent to provide conformal reflective layer 36 at least partially covering the substrate and surrounding either the die pads and/or LED elements. The conformal reflective layer 36 can be of a vertical height relative to the LED chips that is of any height less than the light emitting surface of the LED chips. Masking techniques can be used to introduce and/or remove portions of the conformal reflective layer 36 from substrate 42, for example, to provide for bonding of the metal reflective element to the substrate 42, or for wire bonding, ESD placement, encapsulation, etc.

Figure 10:
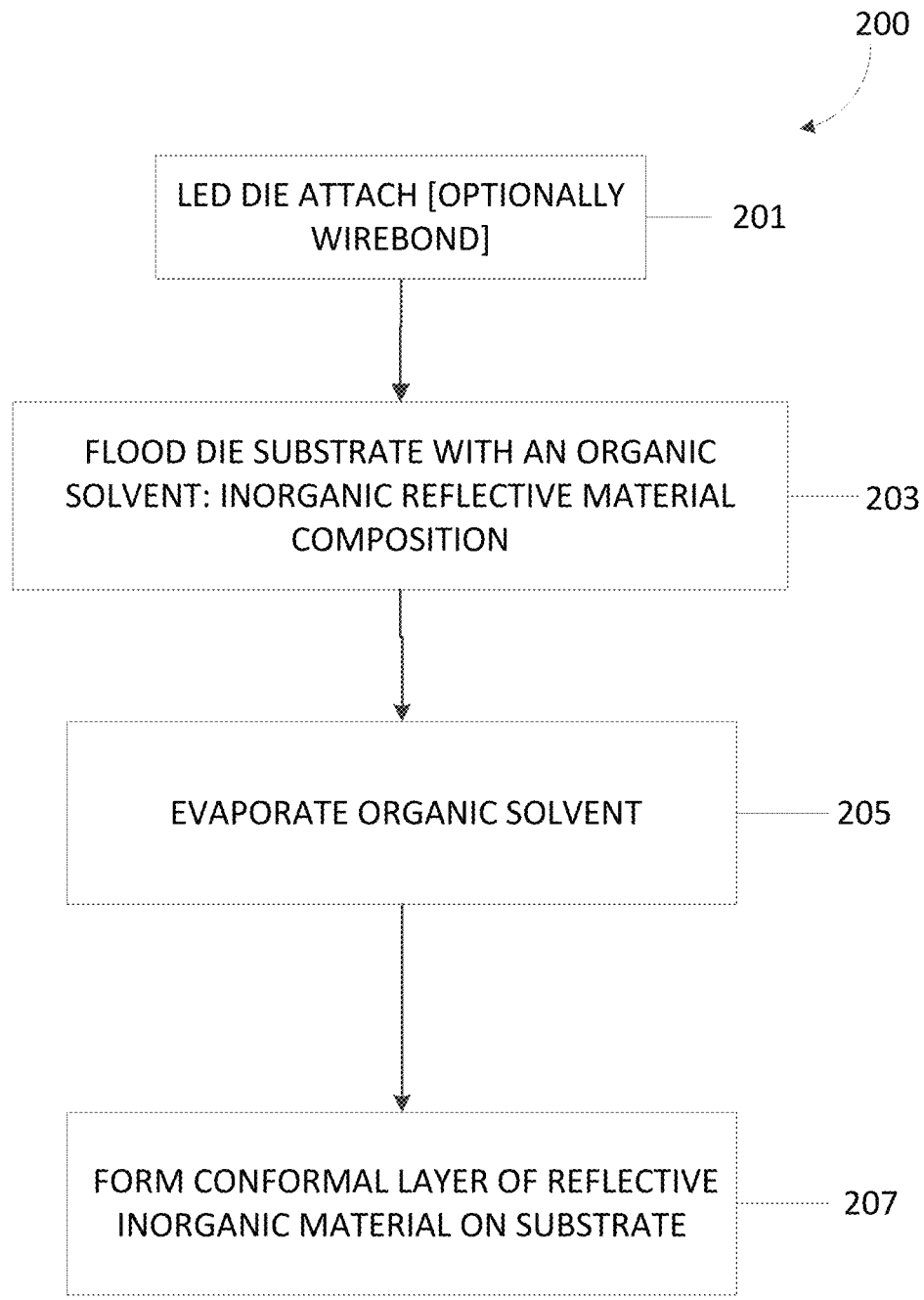
FIG. 10 is a flow chart of a manufacturing embodiment of an LED component according to the present disclosure.

With reference to FIG. 10, describing an exemplary embodiment of a manufacturing method of the solid state lighting package, flow chart 200 is shown, whereas, step 201 includes providing at least one die attached LED element mounted on a substrate or submount, the substrate or submount capable of absorbing the light emitted by the LED element. Step 203 refers to flooding the die substrate with an organic solvent-inorganic reflective material composition as described above. Step 205 refers to the removal of the organic solvent. Step 207 involves forming conformal layer of reflective organic material on the substrate. Optionally, masking techniques can be used to introduce and/or remove portions of conformal reflective layer.

Figure 11:
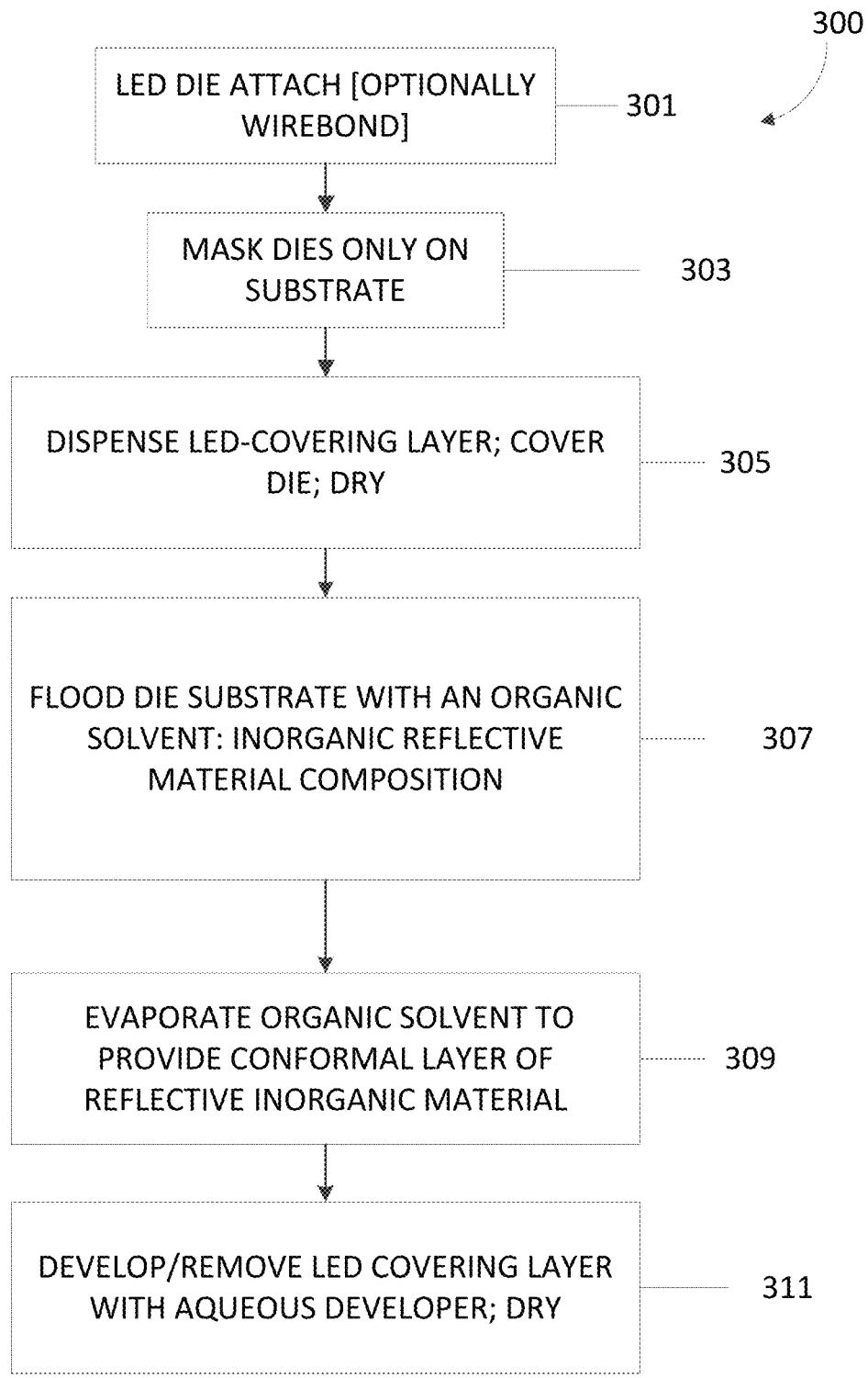
FIG. 11 is a flow chart of another manufacturing embodiment of an LED component according to the present disclosure.

With reference to FIG. 11, describing the manufacturing method of the solid state lighting package, flow chart 300 is shown, wherein, step 301 includes providing at least one die attached LED element mounted on a substrate or submount, the substrate or submount capable of absorbing the light emitted by the LED element. Step 303 refers to masking the LED dies (or contact pads) on the substrate and leaving exposed the remainder thereof. Step 305 provides for dispensing the aqueous-based LED covering layer covering each LED die. Step 305 provides for subsequently drying the LED covering layer. Steps 307-309 are essentially the steps 203-207 of process flowchart 200. Step 311 involves developing and removing the LED covering layer with an aqueous-based developer, which can be water, water/alcohol mixture, basic aqueous-based developers, and the like. Subsequent drying of the substrate to remove residual water is performed, for example, using heat and/or vacuum at temperatures (for accelerated drying) and for times commensurate to preserve the intended performance attributes of the components of the LED covering layer.

Figure 12:
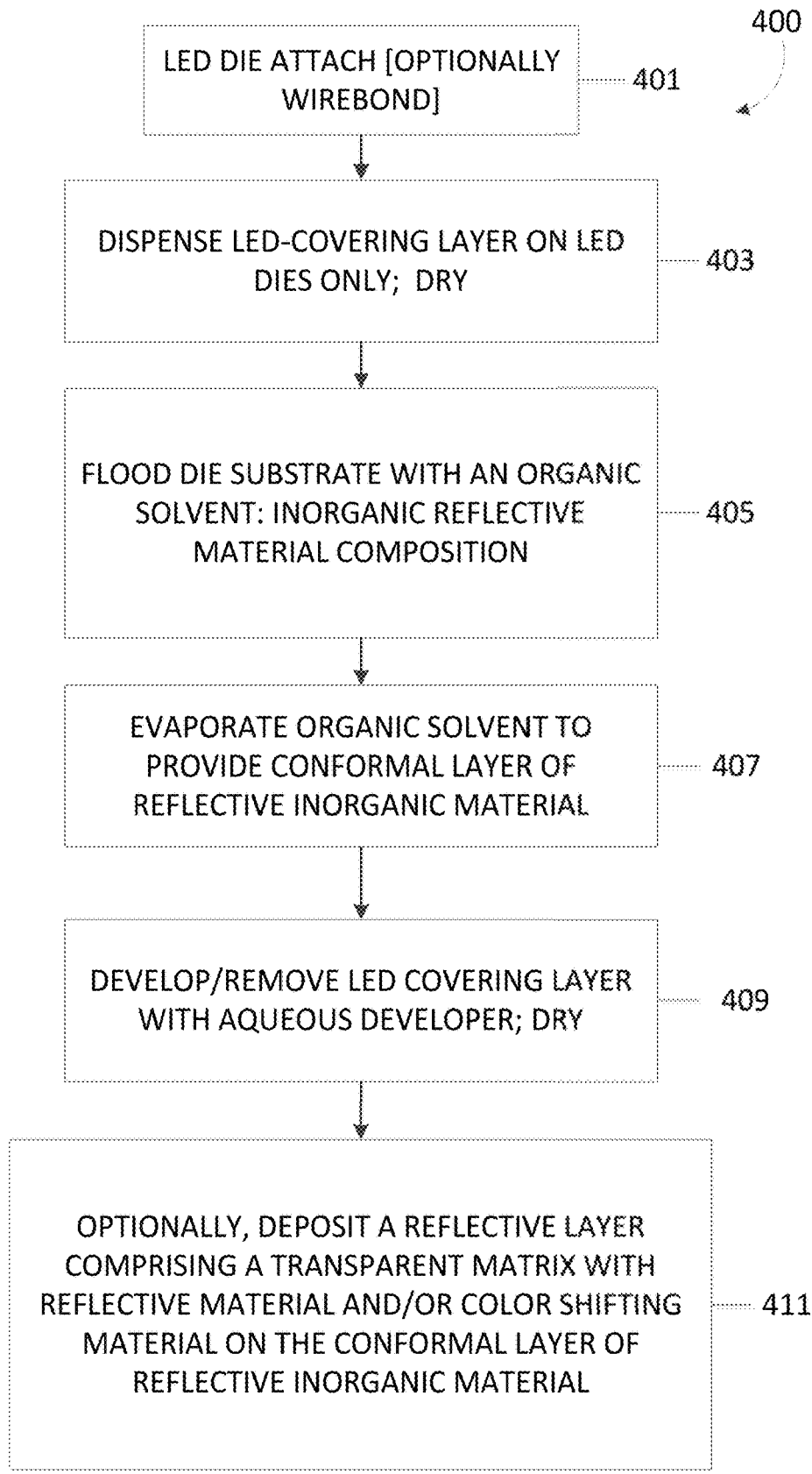
FIG. 12 is a flow chart of another manufacturing embodiment of an LED component according to the present disclosure.

With reference to FIG. 12 and flow chart 400, an embodiment of the manufacturing method is provided, where step 401 includes providing at least one die attached LED elements mounted on a substrate or submount, the substrate or submount capable of absorbing the light emitted by the LED element. Step 403 provides for dispensing the aqueous-based LED covering layer covering each LED die e.g., using a raster printer/dispensing device, or screen printing, or the like, and drying. Steps 405-407 are essentially the same steps 203-207 of process flowchart 200. Step 409 involves developing and removing the LED covering layer with an aqueous-based developer, which can be water, water/alcohol mixture, basic aqueous-based developers, and the like. Subsequent drying of the substrate to remove residual water is performed, for example, using heat and/or vacuum at temperatures and for times commensurate to preserve the intended performance attributes of the components of the LED covering layer. Step 411 provides for depositing a reflective layer comprising a transparent matrix with reflective material and/or color shifting material on the conformal layer of reflective inorganic material. In one aspect the transparent matrix is deposited directly on the conformal layer of reflective inorganic material.

Figure 13:
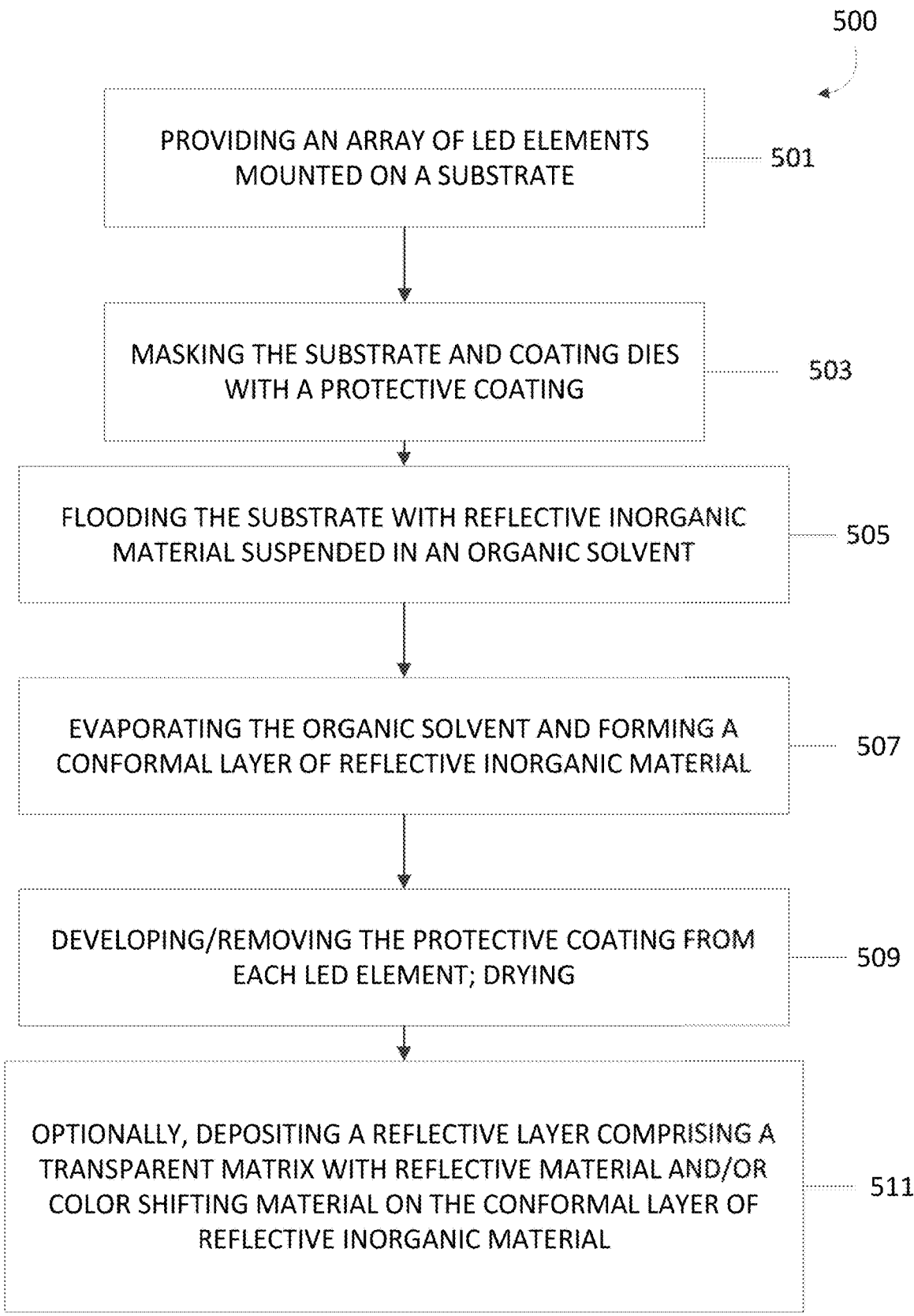
FIG. 13 is a flow chart of another manufacturing embodiment of an LED component according to the present disclosure.

With reference to FIG. 13 and flow chart 500, an aspect of the manufacturing method is provided, where step 501 includes providing an array of LED elements mounted on a substrate or submount, the substrate or submount capable of absorbing the light emitted by the LED element. Step 503 provides for masking the substrate and coating/dispensing the aqueous-based LED covering layer covering each LED die. Steps 505-507 are essentially the same steps 203-207 of process flowchart 200. Step 511 provides for depositing a reflective layer comprising a transparent matrix with reflective material and/or color shifting material on the conformal layer of reflective inorganic material. In one aspect the transparent matrix is deposited directly on the conformal layer of reflective inorganic material. The transparent matrix can be surface-modified, e.g., with a texture, pattern, raised features, surface-roughness or other technique as appropriate, to provide or improve light diffusion, etc.

Methods of Increasing Luminous Flux

The gain in total luminous flux for an array of LED chips manufactured with the conformal reflective layer comprising inorganic particles according to the present disclosure was increased compared to a similar array without the distribution of inorganic particles. In one aspect, 8% to 13% with an average of 10% improvement of total luminous flux was obtained using the conformal reflective layer and methods of application disclosed herein.

By virtue of using the conformal reflective layer it was possible to obtain comparable total luminous flux from a low reflectivity ceramic substrate, high-power configuration (>18 W to about 26 W), "flip chip" configuration (approximately 0.5 mm thick aluminum oxide substrate to that of a 1 mm thick sapphire high reflectivity substrate wirebonded, low-power (<18 W) configuration. Thus, with reference to Table 1, flip-chips samples having the conformal reflective layer were compared with controls without the conformal reflective layer, all samples being constructed of an $Al_2O_3$ substrate. Maximum lumens LM, lumens per watt (LPW) and color rendering index (CRI) are given. The "improvement factor," calculated from the ratio of conformal reflective coated samples to controls is shown to be greater than 1 in all cases tested, demonstrating the instant conformal reflective coating provides a method of increasing the luminous flux of a solid state lighting package. As shown the average improvement factor LF was 1.1 or about a 10% increase in luminous flux.

TABLE 1

Improvement in Luminous Flux using Conformal Reflective Layer (TiO2 is of an average particle size between 300-400 nm prior to solvent-dispersed deposition on substrate).

| Experiment Splits | Treatment/ Conformal Material | Substrate | LM | LPW | CRI | LF Improvement Factor |
|---|---|---|---|---|---|---|
| Control 1 | None | $Al_2O_3$ | 1329 | 105.5 | 84.13 | |
| Sample 1 | $TiO_2$ | $Al_2O_3$ | 1440 | 114.5 | 84.7 | 1.08 |
| Control 2 | None | $Al_2O_3$ | 1159 | 90.72 | 84.9 | |
| Sample 2 | $TiO_2$ | $Al_2O_3$ | 1306 | 102.23 | 85 | 1.13 |
| Control 3 | None | $Al_2O_3$ | 1368 | 108.3 | 85.6 | |
| Sample 3 | $TiO_2$ | $Al_2O_3$ | 1473 | 116.7 | 85.5 | 1.08 |
| Control 4 | None | $Al_2O_3$ | 1321 | 103.6 | 85.8 | |
| Sample 4 | $TiO_2$ | $Al_2O_3$ | 1452 | 114 | 85.2 | 1.10 |
| | | | | | Avg. LF Gain | 1.10 |

Thus, solid state lighting packages including the conformal reflective layer comprising distribution of inorganic particles of the present disclosure significantly increases the luminous efficacy as compared to a similar solid state lighting package without the distribution of inorganic particles, in particular, flip chip or upward-emitting die configurations. Similar results were observed or can be expected for various packages including packages having metal reflectors and the like.

As the conformal reflective layer is readily adaptable to a post-mounted, wire bonded LED package, with the distribution of inorganic particles being readily introduced to the LED edges and channels in-between, minimal modification to existing LED packaging manufacturing is needed. The methods according to the present disclosure are adaptable to monolithic LED structures with or without metal reflector elements and/or modification of the reflector.

The distribution of inorganic particles and methods of manufacturing, and methods of increasing the total luminous flux of a solid state lighting package are generally applicable to a variety of existing lighting packages, for example, XLamp products XM-L, ML-B, ML-E, MP-L EasyWhite, MX-3, MX-6, XP-G, XP-E, XP-C, MC-E, XR-E, XR-C, and XR LED packages manufactured by Cree, Inc. The benefits in luminous flux can be applied to many lighting applications, for example, commercial/retail display spotlights, LED retrofit bulbs, and other indoor and outdoor general-illumination applications.

The above has been described both generically and with regard to specific embodiments. Although the present disclosure has been set forth in what is believed to be the preferred embodiments, a wide variety of alternatives known to those of skill in the art can be selected within the generic disclosure. Other advantages and obvious modifications of the present disclosure will be apparent to the artisan from the above description and further through practice of the present disclosure.

I claim:
1. A solid state lighting package comprising:
   a substrate or a submount comprising a top surface that absorbs at least one wavelength of light emitted by a plurality of LED elements, each of the plurality of LED elements comprising at least one light emitting surface;
   a plurality of metal contacts or pads directly on the top surface of the substrate or the submount, the plurality of metal contacts or pads each having at least one side surface projecting vertically from the top surface of the substrate or the submount by a height, and at least one electrical connector connecting the plurality of metal contacts or pads;
   the plurality of LED elements positioned on the plurality of metal contacts or pads, wherein the plurality of LED elements are in a densely packed arrangement forming a plurality of channels between adjacent ones of the plurality of LED elements;
   a conformal reflective layer having a thickness, wherein the height of the at least one side surface of each of the plurality of metal contacts or pads is greater than or equal to the thickness of the conformal reflective layer, the conformal reflective layer positioned in the plurality of channels and covering the at least one electrical connector and at least a portion of the top surface and conformally attached to the at least one side surface of the plurality of metal contacts or pads without covering the at least one light emitting surface of the plurality of LED elements, wherein the conformal reflective layer comprises a plurality of inorganic compounds arranged in a dense layer of material; and a transparent matrix deposited on the conformal reflective layer and surrounding each of the plurality of metal contacts or pads, the transparent matrix being spaced from and not covering the plurality of LED elements.

2. The solid state lighting package of claim 1, wherein the conformal reflective layer consists essentially of inorganic particles of at least one of titanium dioxide, silicon dioxide, zinc oxide, or mixtures thereof.

3. The solid state lighting package of claim 1, wherein the conformal reflective layer surrounds each of the plurality of LED elements.

4. The solid state lighting package of claim 1, wherein the transparent matrix is at least one of a polydialkylsiloxane, polydialkylphenylsiloxane, polydialkylalkylphenylsiloxane, and polyalklyphenylsiloxanes, or blends thereof.

5. The solid state lighting package of claim 4, wherein the transparent matrix is directly deposited on the conformal reflective layer.

6. The solid state lighting package of claim 1, wherein the height of the at least one side surface of the metal contact or pad is equal to the thickness of the conformal reflective layer.

7. The solid state lighting package of claim 1, wherein the plurality of LED elements are post die attached and wire bonded to the substrate or the submount.

8. The solid state lighting package of claim 4, wherein the transparent matrix has an index of refraction of between about 1.4 and about 1.5.

9. The solid state lighting package of claim 4, wherein the transparent matrix further comprises a highly reflective material.

* * * * *